(12) United States Patent
Diglio et al.

(10) Patent No.: US 12,057,370 B2
(45) Date of Patent: Aug. 6, 2024

(54) VACUUM MODULATED TWO PHASE COOLING LOOP EFFICIENCY AND PARALLELISM ENHANCEMENT

(71) Applicant: Intel Corporation, Santa Clara, CA (US)

(72) Inventors: Paul Diglio, Gaston, OR (US); Pooya Tadayon, Portland, OR (US); David Shia, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 735 days.

(21) Appl. No.: 17/030,137

(22) Filed: Sep. 23, 2020

(65) Prior Publication Data

US 2021/0351108 A1 Nov. 11, 2021

Related U.S. Application Data

(63) Continuation-in-part of application No. 16/871,424, filed on May 11, 2020.

(51) Int. Cl.
*H01L 23/34* (2006.01)
*C23C 16/00* (2006.01)
*H01L 23/473* (2006.01)

(52) U.S. Cl.
CPC ............. *H01L 23/4735* (2013.01)

(58) Field of Classification Search
CPC . H01L 23/4735; H01L 22/12; C23C 16/4586; C23C 16/46
USPC .......................................... 257/715; 118/724
See application file for complete search history.

(56) References Cited

U.S. PATENT DOCUMENTS

| | | | |
|---|---|---|---|
| 2,925,224 A | 2/1960 | Cunningham | |
| 4,928,884 A | 5/1990 | Smith | |
| 5,375,431 A * | 12/1994 | Later ............... | A23L 3/0155 62/288 |
| 5,386,703 A * | 2/1995 | Later ............... | A23L 3/0155 62/264 |
| 5,992,169 A * | 11/1999 | Later ............... | A23L 3/0155 62/264 |

(Continued)

OTHER PUBLICATIONS

Final Office Action for U.S. Appl. No. 16/871,424 mailed Oct. 31, 2022, 6 pages.

(Continued)

*Primary Examiner* — Davis D Hwu
(74) *Attorney, Agent, or Firm* — Schwabe, Williamson & Wyatt P.C.

(57) ABSTRACT

Embodiments disclosed herein include a temperature control system. In an embodiment, the temperature control system comprises a fluid reservoir for holding a fluid, and a spray chamber fluidically coupled to the fluid reservoir. In an embodiment, a pump is between the spray chamber and the fluid reservoir, where the pump provides the fluid to the spray chamber. In an embodiment, the temperature control system further comprises, a plurality of fluid lines between the pump and the spray chamber, where individual ones of the plurality of fluid lines are configured to provide the fluid to the spray chamber. In an embodiment, the temperature control system further comprises, a vacuum source fluidically coupled to the spray chamber, where the vacuum source controls a pressure within the spray chamber.

13 Claims, 19 Drawing Sheets

(56) References Cited

U.S. PATENT DOCUMENTS 7,594,616 B2 9/2009 Hupp
2010/0039117 A1 2/2010 Jacobs

OTHER PUBLICATIONS

Office Action for U.S. Appl. No. 16/871,424 mailed Jul. 27, 2022, 7 pages.
Prabhakar Subrahmanyam et al., "Micro-Scale Nozzled Jet Heat Transfer Distributions and Flow Field Entrainment Effects Directly on Die", May 28-31, 2019, 18th IEEE Intersociety conference on Thermal and Thermomechanical Phenomena in Electronic Systems (ITherm), 16 pgs.
Office Action for U.S. Appl. No. 17/030,141 mailed Sep. 18, 2023, 7 pgs.
Notice of Allowance for U.S. Appl. No. 17/030,141 mailed Jan. 8, 2024, 7 pgs.

\* cited by examiner

VACUUM MODULATED TWO PHASE COOLING LOOP EFFICIENCY AND PARALLELISM ENHANCEMENT

CROSS-REFERENCE TO RELATED APPLICATIONS

This application is a continuation in part of U.S. patent application Ser. No. 16/871,424, filed May 11, 2020, and titled "Directly Impinging Pressure Modulated Spray Cooling And Methods Of Target Temperature Control", the entire contents of which are hereby incorporated by reference herein.

TECHNICAL FIELD

Embodiments of the present disclosure relate to semiconductor devices, and more particularly to thermal solutions for dies that include nozzles.

BACKGROUND

Electronic packages typically undergo stress testing in order to validate the functionality. Stress testing may include cycling the temperature of the one or more dies in the electronic package. Thermal cycling may be used to accelerate failure of semiconductor packages as part of the product reliability validation. Peltier devices are commonly used to implement the thermal cycling. However, Peltier devices degrade during use and may require replacement during the testing in order to achieve the expected performance. As such, the duration and the cost of stress testing is increased.

Alternative thermal cycling systems have been proposed. One such system includes a temperature chamber with an electric heater and a refrigeration system. However, such systems do not provide individual temperature control on each of the die under test (DUT) since the temperature chamber heats and cools the whole chamber to the same temperature. Additionally, the thermal response time is low since heat transfer is largely limited to convection. Direct contact cooling/heating is another solution. However, direct contact solutions are limited in thermal performance due to the thermal resistance of the thermal interface material (TIM) between the package and the thermal solution. Additionally, direct contact solutions typically cannot address localized hotspots. Another system that has been used is a direct liquid micro channel (DLMC) architecture. DLMC architectures have a uniformly impinging medium against the surface of the package. However, DLMC is of limited use because it cannot implement temperature cycling nor can it account for non-uniform hotspots.

In addition to die testing applications, thermal control is also an issue during the operation of dies. As thermal design power (TDP) increases with process node scaling, thermal control is becoming an increasingly problematic barrier to optimal device operation. Some solutions for thermal management include immersion cooling, micro-channel cooling, and vapor chamber cooling.

Immersion cooling requires complete motherboard and CPU submersion in the working fluid. As such, the fluid must be a good dielectric, such as fluorinerts. However, such working fluids suffer from a low thermal conductivity/specific heat and cannot pull as much heat compared to water. In micro-channel architectures, micro-channels are placed on (or in) the silicon device. The working fluid passed through the channels absorb the heat through the channel walls. However, fluid flow rates are high and the infrastructure to enable such cooling architectures is complex. As such, this solution is expensive and cumbersome. Vapor chamber cooling has a limited working window (i.e., they do not operate below a certain power density of approximately 20 W/cm$^2$), and the working temperature is limited by vapor chamber design (e.g., vacuum conditions, size, wick design, etc.). Vapor chambers also are susceptible to "dry-out" when the temperature and/or power density exceeds the unit's capability. This results in an immediate die over-temperature event.

EMBODIMENTS OF THE PRESENT DISCLOSURE

Described herein are thermal solutions for dies that include nozzles, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, current die testing thermal control systems are not able to provide consistent temperature control. Particularly, the use of Peltier devices is limited due to their degradation during testing. Accordingly, embodiments disclosed herein utilize a direct jet impingement thermal solution. Embodiments include an architecture that allows for thermal cycling with a jet impingement solution by having controllable knobs. For example, the temperature of the die may be modulated by changing one or more of: (1) a distance between the nozzle exits and the die; (2) a fluid velocity out of the nozzle; and (3) a temperature of the impinging fluid. These three parameters may be changed on the fly without the need to replace hardware. Additionally, the number of nozzles and/or the shape of the nozzles may be changed (by replacement of the nozzle plate) in order to provide different temperature ranges. The replacement of the nozzle plate may be implemented manually, or by a robotic system for handling various nozzle plates.

The direct jet impingement solution described herein is also more flexible than existing solutions. For example, the layout of the nozzles may be chosen to selectively remove heat from hot-spot areas on the die. Additionally, multi-die architectures are also easily accommodated. In some embodiments, separate nozzle plates are used for different dies. As such, the temperature cycling of individual dies in a system can be independently controlled.

Figure 1A:
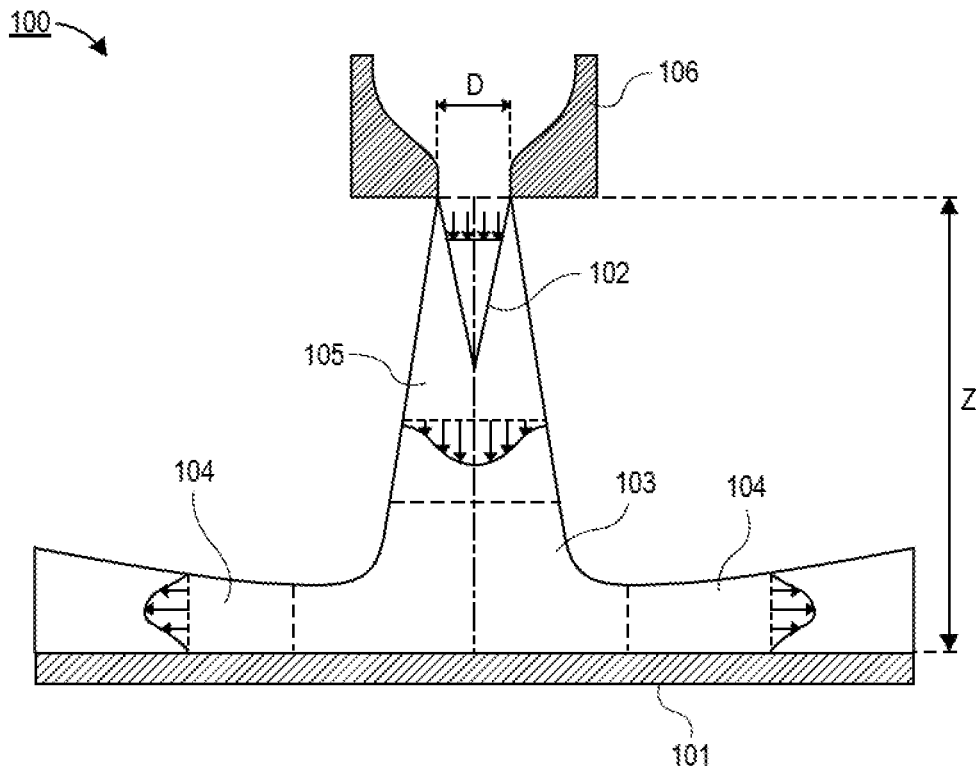
FIG. 1A is a schematic that illustrates the flow conditions resulting from direct impingement of a fluid on a surface, in accordance with an embodiment.

Referring now to FIG. 1A, a schematic of the fluid flow in a direct impingement system 100 is shown, in accordance with an embodiment. The direct impingement system 100 comprises a nozzle 106 and an impingement surface 101. The nozzle 106 may have an opening with a dimension D. The nozzle 106 is spaced away from the impingement surface 101 by a distance Z. In embodiments disclosed herein, the distance Z may be modulated to provide temperature control of the impingement surface 101. Particularly, as Z is decreased, the heat dissipation of the impingement surface 101 is increased, which result in a temperature drop of the impingement surface 101. Decreases in Z will bring the potential core 102 (which is within the free jet region 105) closer to the impingement surface 101. The distance Z may be reduced up to the height of the potential core 102 in some embodiments. As the distance Z is reduced the impingement zone 103 (where the most heat transfer occurs) grows. Outside of the impingement zone 103 is the wall jet zone 104. Fluid velocities (as indicated by arrows) are also provided for illustrative purposes.

Figure 1B:
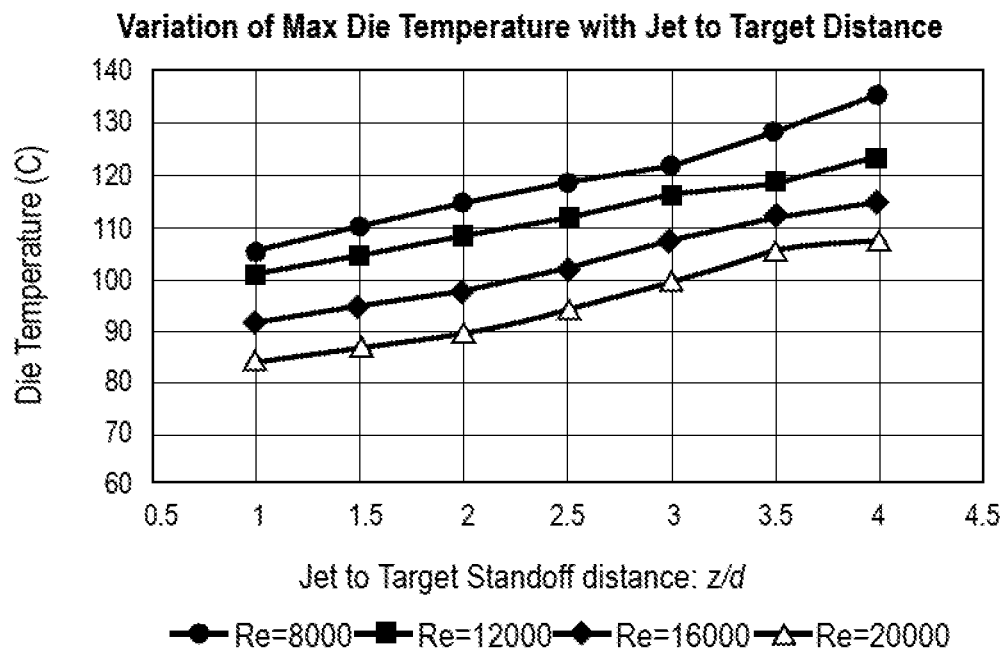
FIG. 1B is a graph that illustrates several of the boundary conditions that may be modulated in order to provide a desired die temperature in accordance with an embodiment.

Referring now to FIG. 1B, a graph of die temperature with respect to the nozzle standoff distance Z/D is shown for various flow rates (as indicated by the Reynolds number Re) of a fluid with a given temperature. As shown, higher stand-off heights Z/D generally result in higher die temperatures. Additionally, increases in the flow rate will generally result in lower die temperatures. Therefore, modulations to the standoff height Z/D and the flow rate Re may be made to provide any desired die temperature between approximately 80° C. and 135° C. It is to be appreciated that standoff heights Z/D and flow rates Re are not limited to the data points shown, and the obtainable temperature range of the die temperature may extend beyond 80° C. and 135° C.

Additionally, FIG. 1B depicts the data points for a working fluid at one temperature. It is to be appreciated that reducing or increasing the temperature of the working fluid will result in different die temperature ranges. For example, at a high flow rate Re (e.g., 20,000) and a working fluid temperature at approximately −70° C., a die temperature of less than 0° C. may be obtained. Accordingly, by modulating one or more of standoff height Z/D, flow rate Re, and working fluid temperature, a die temperature range from approximately −40° C. to 135° C. (or greater) may be obtained. In some embodiments, a reservoir of working fluid may be temperature controlled (e.g., with a heater and/or a chiller). In some embodiments a pair of reservoirs of working fluid may be used. For example, a first reservoir may be maintained at a first temperature and the second reservoir may be maintained at a second temperature that is lower than the first temperature. As such, temperature cycling between the first temperature and the second temperature can be rapidly implemented.

Furthermore, the graph in FIG. 1B illustrates temperature ranges for a package with a high power density (e.g., approximately 10 W/mm$^2$). It is to be appreciated that at lower power densities, the die temperature range may be expanded, For example, an obtainable die temperature may be less than approximately −40° C. or greater than approximately 135° C.

Figure 5A:
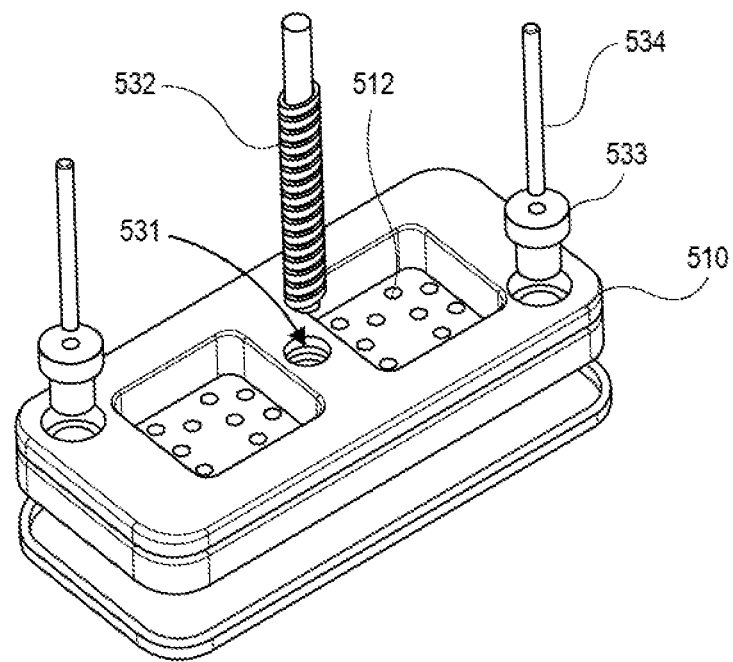
FIG. 5A is an exploded view illustration of a nozzle plate with a lead screw for displacing the nozzle plate, in accordance with an embodiment.

Also, in an embodiment comprising a multi-chip package (MCP), with two different chips dissipating two different power scenarios, a dual chamber of nozzles may be implemented. For the higher power dissipating chip, a coolant fluid such as water with higher thermal conductivity is allowed to be impinged on the die as the working fluid. For the lower power dissipating chip, such as a PCH chip for instance, it is desirable to have a lower conductivity fluids such as air as the impinging fluid. This dual chamber nozzle design is illustrated in FIG. 5A. Accordingly, embodiments disclosed herein are able to dispense two different fluids simultaneously, as necessary, to dissipate heat from multi-chip packages involving multiple dies.

Figure 2A:
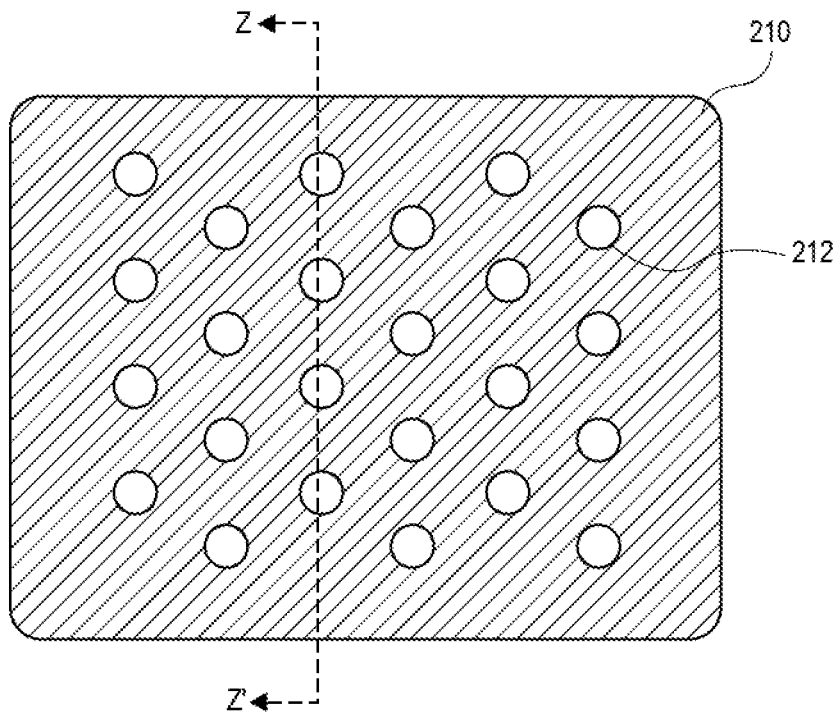
FIG. 2A is a plan view illustration of a nozzle plate with a plurality of orifices, in accordance with an embodiment.

Referring now to FIG. 2A, a plan view illustration of a nozzle plate 210 is shown, in accordance with an embodiment. The nozzle plate 210 may comprise an array of orifices 212 that pass through the nozzle plate 210. The array of orifices 212 may have any pattern. In FIG. 2A, the orifices 212 are shown in a substantially regular grid. However, it is to be appreciated that the orifices 212 may be positioned in an irregular pattern. For example, the orifices 212 may be positioned so they align with hotspots of a die (not shown). In the illustrated embodiment, twenty four orifices 212 are shown. However, it is to be appreciated that any number of orifices 212 may be included on the nozzle plate 210. Changing the number of orifices 212 in the nozzle plate 210 may be one of several boundary conditions that may be modulated to provide a desired die temperature. In an embodiment, the nozzle plate 210 may comprise any suitable material. In some embodiments, the nozzle plate 210 may comprise a metallic material (e.g., stainless steel). In other embodiments, the nozzle plate 210 may comprise a polymeric material.

Figure 2B:
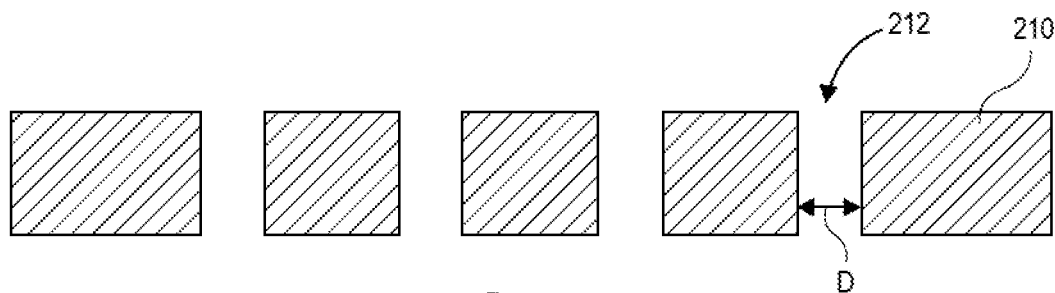
FIG. 2B is a cross-sectional illustration of the nozzle plate in FIG. 2A with uniform diameter orifices, in accordance with an embodiment.
Figure 2C:
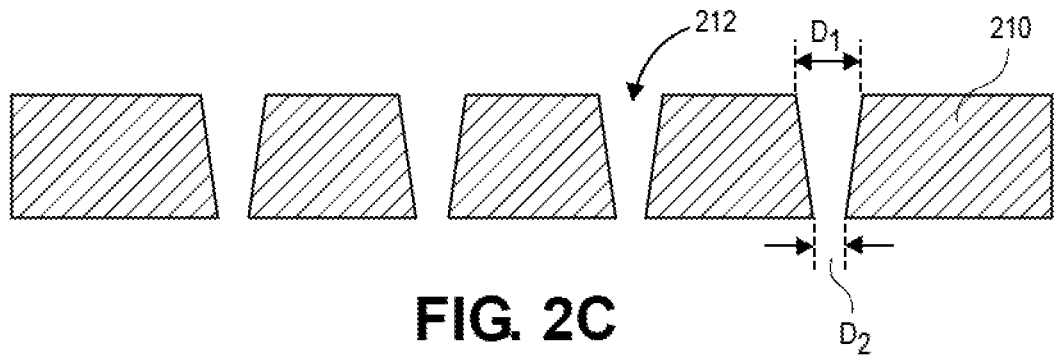
FIG. 2C is a cross-sectional illustration of the nozzle plate in FIG. 2A with tapered orifices, in accordance with an embodiment.

Referring now to FIGS. 2B and 2C, cross-sectional illustrations of the nozzle plate 210 in FIG. 2A along line 2-2' are shown, in accordance with different embodiments. As shown in FIG. 2B, the orifices 212 have a constant diameter D. A constant diameter D results in an substantially constant fluid flow rate through the nozzle plate 210. In an embodiment, the diameter D may be between approximately 0.125 mm and approximately 1.0 mm. As shown in FIG. 2C, the orifices 212 have first diameter $D_1$ at an upstream side of the nozzle plate 210 and a second diameter $D_2$ at a downstream side of the nozzle plate 210. In a particular embodiment, the second diameter $D_2$ is smaller than the first diameter $D_1$. For example, the first diameter $D_1$ may be approximately 0.50 mm and the second diameter $D_2$ may be approximately 0.125 mm. Such an orifice may be referred to as a tapered orifice herein. Reducing the second diameter $D_2$ results in an increase in the flow rate through a thickness of the nozzle plate 210. Changing the shape of orifices 212 in the nozzle plate 210 may be one of several boundary conditions that may be modulated to provide a desired die temperature.

Figure 3A:
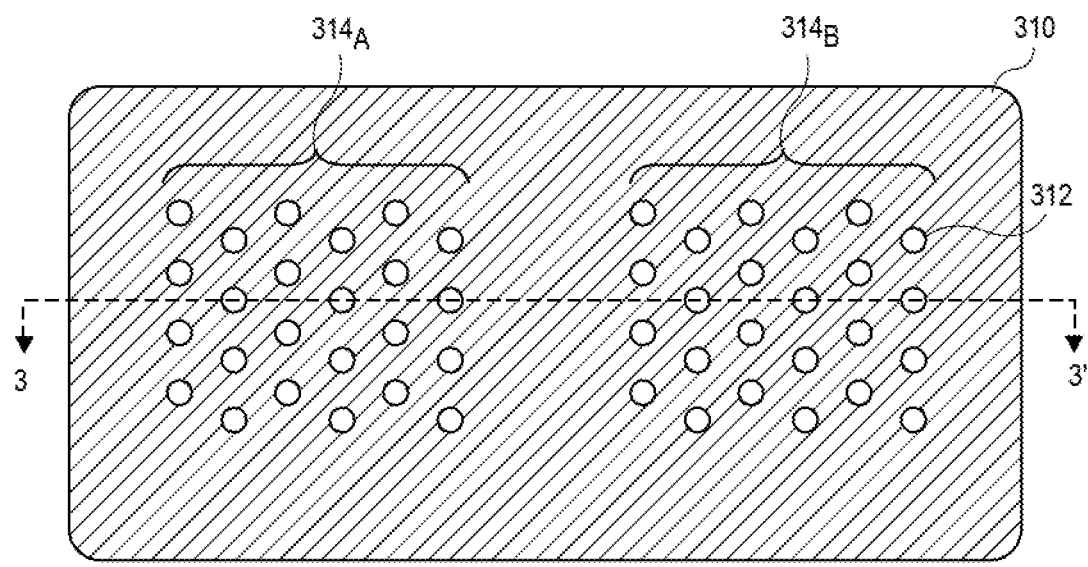
FIG. 3A is a plan view illustration of a nozzle plate with a first array of orifices and a second array of orifices, in accordance with an embodiment.

Referring now to FIG. 3A, a plan view illustration of a nozzle plate 310 for use in controlling temperature in a multi-die package is shown, in accordance with an additional embodiment. The nozzle plate 310 comprises a first array $314_A$ of orifices 312 and a second array $314_B$ of orifices 312. The first array $314_A$ of orifices 312 may be used to provide thermal control of a first die (not shown) and the second array $314_B$ of orifices 312 may be used to provide thermal control of a second die (not shown). As shown, the first array $314_A$ and the second array $314_B$ are substantially similar. However, it is to be appreciated that the layout of the orifices 312 in each array 314 and/or a number of orifices 312 in each array 314 may be non-uniform in order to account for differences between the first die and the second die. For example, the two dies may have different footprints and/or different hotspot locations.

Figure 3B:
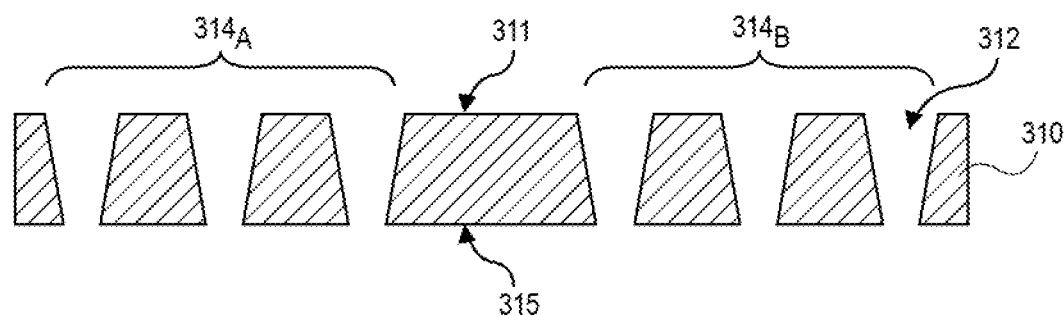
FIG. 3B is a cross-sectional illustration of the nozzle plate in FIG. 3A with the orifices passing through an entire thickness of the nozzle plate, in accordance with an embodiment.
Figure 3C:
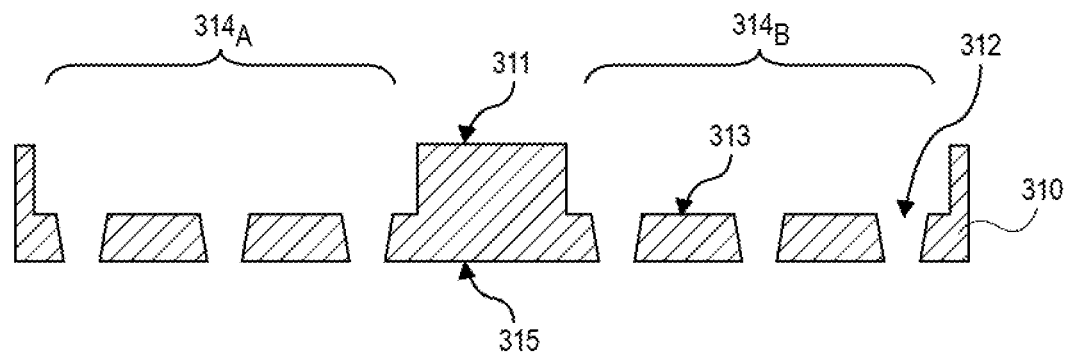
FIG. 3C is a cross-sectional illustration of the nozzle plate in FIG. 3A with the orifices positioned within recesses in the nozzle plate, in accordance with an embodiment.

Referring now to FIGS. 3B and 3C, cross-sectional illustrations along lines 3-3' of FIG. 3A are shown, in accordance with various embodiments. As shown in FIG. 3B, the orifices 312 pass entirely through a thickness of the nozzle plate 310 from an upstream surface 311 to a downstream surface 315. While tapered orifices 312 are shown, it is to be appreciated that constant diameter orifices 312 may also be provided. As shown in FIG. 3C, the orifices 312 are positioned in recesses in the nozzle plate 310. That is, the orifices 312 pass through the nozzle plate 310 from a recessed surface 313 to the downstream surface 315.

Figure 3D:
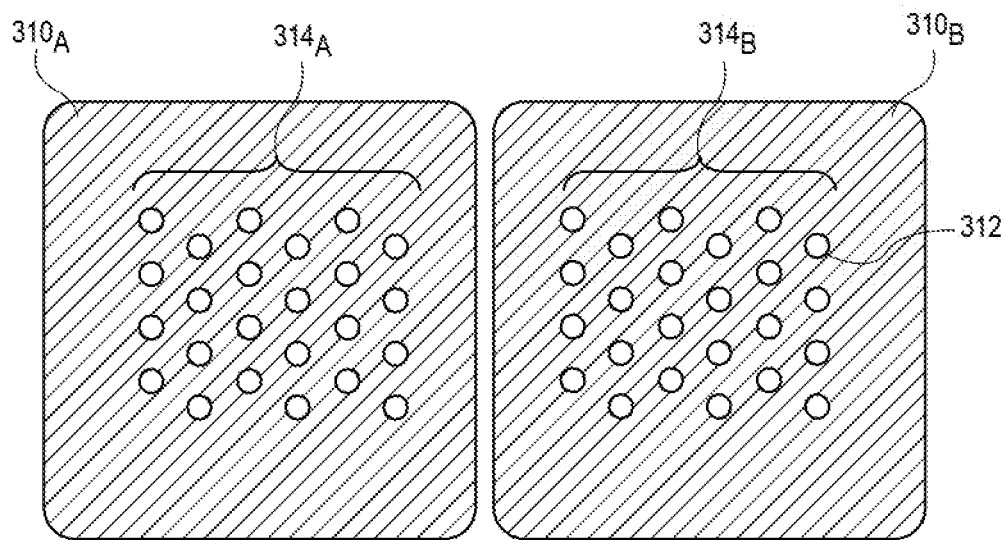
FIG. 3D is a cross-sectional illustration of a pair of adjacent nozzle plates, in accordance with an embodiment.

Referring now to FIG. 3D, a plan view illustration of a pair of nozzle plates $310_A$ and $310_B$ are shown, in accordance with an embodiment. The first nozzle plate $310_A$ may comprise a first array $314_A$ of orifices 312, and the second nozzle plate $310_B$ may comprise a second array $314_B$ of orifices 312. The use of discrete nozzle plates $310_A$ and $310_B$ allow for independent control of the temperature of different dies within an electronic package. For example, the use of discrete nozzle plates 310 allows for the first nozzle plate $310_A$ to have a first standoff distance $Z_1$ and the second nozzle plate $310_B$ to have a second standoff distance $Z_2$ that is different than the first standoff distance $Z_1$.

Figure 4A:
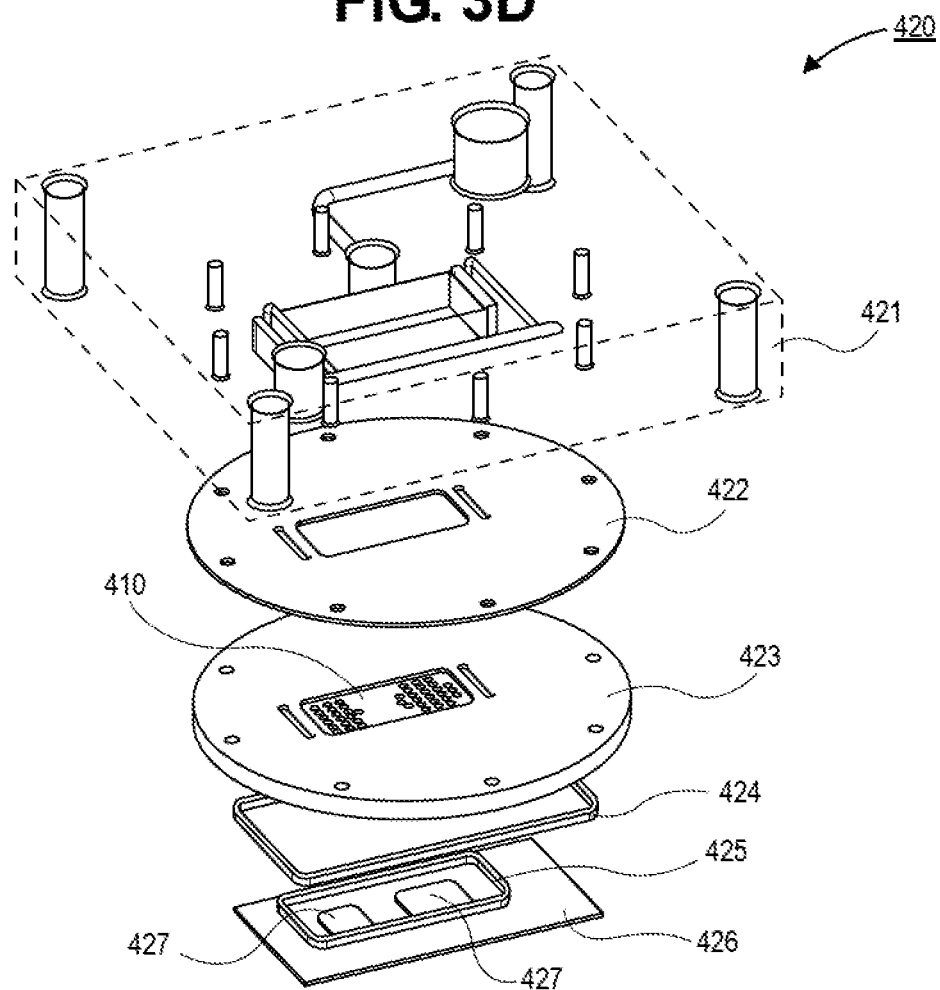
FIG. 4A is an exploded view illustration of a thermal testing unit with a nozzle plate, in accordance with an embodiment.

Referring now to FIG. 4A, an exploded view illustration of a thermal testing unit 420 is shown, in accordance with an embodiment. The thermal testing unit 420 may comprise a housing 421, a nozzle frame 423, and a nozzle plate 410 within the nozzle frame 423. In an embodiment, the nozzle plate 410 may be similar to any of the nozzle plate embodiments described above with respect to FIGS. 2A-3D. In an embodiment, a seal plate 422 (e.g., an O-ring sealant plate) may separate the housing 421 from the nozzle frame 423. One or more gaskets 424 and 425 may be positioned between the nozzle frame 423 and a package substrate 426. One or more dies 427 may be positioned within an innermost gasket 425. The dies 427 may be lidded or bare dies.

Figure 4B:
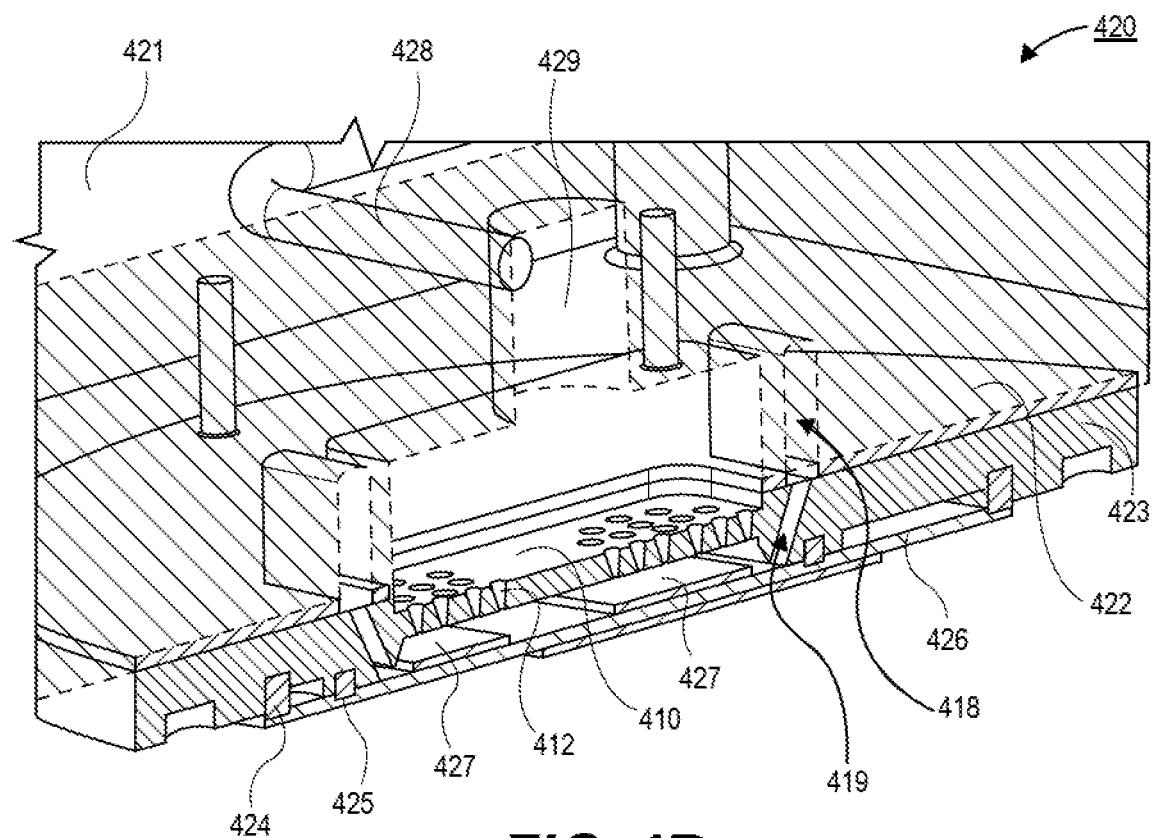
FIG. 4B is a sectional illustration of a thermal testing unit with a nozzle plate, in accordance with an embodiment.

Referring now to FIG. 4B, a sectional illustration of a thermal testing unit 420 is shown, in accordance with an embodiment. As shown, the housing 421 comprises a fluid inlet pipe 428 that feeds a port 429. The port 429 is fluidically coupled to the nozzle plate 410. Fluid may pass through the orifices 412 of the nozzle plate 410 and impinge the underlying dies 427. The fluid may then pass through exit holes 419 between the nozzle plate 410 and the nozzle frame 423 to reach an exit port 418 in the housing 421. The one or more gaskets 424 and 425 may confine the fluid to the region surrounding the die 427. In an embodiment, the fluid for the thermal testing unit 420 may be water. Other embodiments may include other fluids, such as fluorinerts. Additionally, the fluid may also be a gas, such as air, helium, etc.

Referring now to FIG. 5A, an exploded view illustration of a nozzle plate 510 with an actuation mechanism 532 is shown, in accordance with an embodiment. The actuation mechanism 532 provides displacement in the vertical (Z) direction and allows for the standoff height Z between the orifices 512 and a die (not shown) to be changed. As described above, changes to the standoff height Z allow for modulation of the temperature of the die. In the illustrated embodiment, the actuation mechanism 532 is a screw, such as a lead screw. The screw of the actuation mechanism 532 may insert into a threaded hole 531. Bushings 533 and alignment pins 534 may also be included to guide the actuation mechanism. While a lead screw is shown, it is to be appreciated that embodiments may use any suitable actuation mechanism, (e.g., hydraulics, or any other linear actuator). The actuation mechanism 532 may be driven by a motor 535 or the like.

Figure 5B:
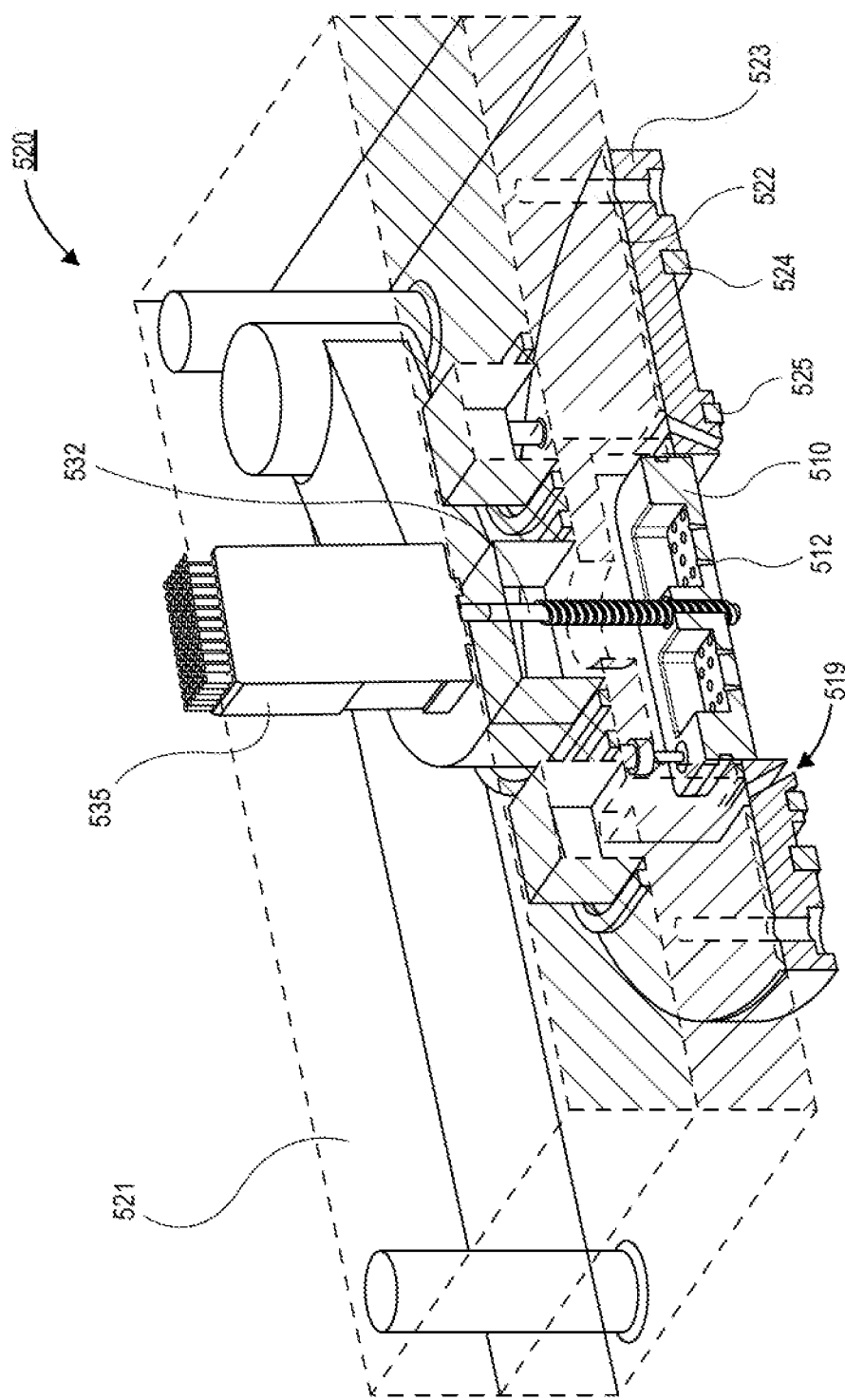
FIG. 5B is a sectional illustration of a thermal testing unit with a displaceable nozzle plate, in accordance with an embodiment.

Referring now to FIG. 5B, a sectional illustration of a thermal testing unit 520 with an actuatable nozzle plate 510 is shown, in accordance with an embodiment. In an embodiment, the thermal testing unit 520 comprises a housing 521, a seal plate 522, and a nozzle frame 523. A nozzle plate 510 is disposed within the nozzle frame 523. In an embodiment, the nozzle plate 510 may be substantially similar to any of the nozzle plates described herein. Exit holes 519 may be provided between the nozzle plate 510 and the nozzle frame 523 to remove working fluid after impingement on a die (not shown). One or more gaskets 524 and 525 may surround the nozzle plate 510.

In an embodiment, an actuation mechanism 532 passes through the housing 521 and is mechanically coupled to the nozzle plate 510. For example, a lead screw is shown as the actuation mechanism 532 in FIG. 5B. In an embodiment, the lead screw is driven by a motor 535 that is over the housing 521. The motor 535 may be controlled by a control unit (not shown) that raises and/or lowers the nozzle plate 510 in order to provide temperature cycling of the die or dies (not shown).

In an embodiment, the controller may also provide modulation of a working fluid flow rate and/or working fluid temperature. Accordingly, the die temperature may be modulated over a larger range by controlling the various boundary conditions. Additionally, the nozzle plate 510 may be replaceable in order to accommodate different hotspots in different dies, to provide fewer or more orifices 512, and/or to provide a different shape of the orifices.

In FIG. 5B, a single actuation mechanism 532 is shown. However, it is to be appreciated that additional actuation mechanisms 532 may be included. For example, when discrete nozzle plates 510 are provided for each die (e.g., similar to FIG. 3D), each nozzle plate 510 may be controlled independently with different actuation mechanisms 532.

While the embodiments described above are particularly useful for die testing and validation applications, embodiments disclosed herein may also comprise thermal control systems for dies during normal use conditions instead of (or in addition to) die testing and validation.

As noted above the increased power demands of advanced node dies has resulted in significant increases in TDP. Current solutions are either not adequate to meet the heat transfer needs for such high power outputs, and/or the solutions are complex and expensive. Accordingly, embodiments disclosed herein include a spray chamber that is disposed over the die. In an embodiment, the spray chamber is a pressure controlled chamber. Changing the pressure within the chamber allows for modulation of the boiling point of the working fluid that is sprayed over the die within the chamber. Particularly, reducing the boiling point allows for a rapid phase change to remove a significant amount of thermal energy from the die. For example, power removal has been shown in excess of approximately 250 W/cm$^2$, and 1,000 W total for exemplary systems without much optimization.

Such thermal solutions also provide fast thermal control. This is because there is little to no thermal mass of an additional heat exchanger in the system. As such, rapid temperature control is provided. Additionally, there is a low thermal gradient on the die when using such systems. This because the areas of higher temperature (i.e., hotspots) will drive a phase change of the working fluid more rapidly. Such thermal solutions also avoid the issue of "dry-out" that hamper the use of traditional vapor chambers, as described above. Dry-out is avoided because the fluid dispense volume may be directly regulated by the cooling system controller. That is, more working fluid can be readily applied to the die from a reservoir. Additionally, infrastructure requirements and fluid flow-rates needed to operate embodiments disclosed herein at large scale (e.g., servers, high performance computing (HPC), etc.) are minimal compared to those of traditional microchannel heat exchangers.

Furthermore, while described herein as a thermal solution used for dies in normal operating conditions, it is to be appreciated that similar systems may be utilized in die testing and validation setups. For example, the temperature range is not limited since the working fluid can be easily exchanged to better match the targeted test set point relative to the working fluids range of boiling points.

Figure 6A:
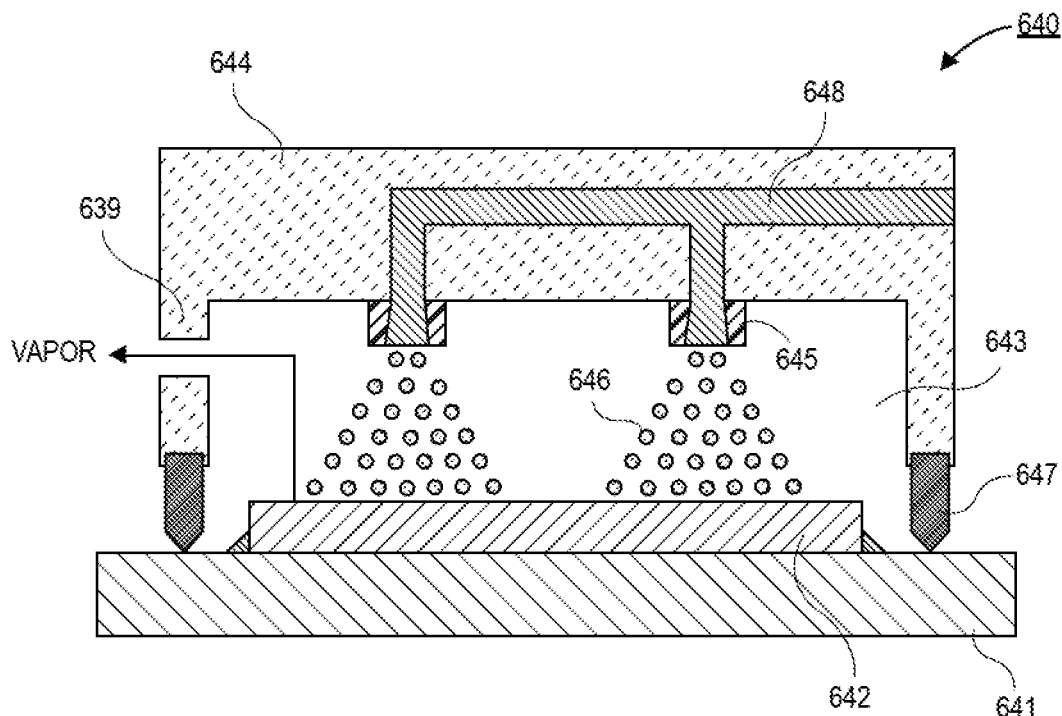
FIG. 6A is a cross-sectional illustration of a die with a vacuum modulated cooling system, in accordance with an embodiment.

Referring now to FIG. 6A, a cross-sectional illustration of an electronic package 640 is shown, in accordance with an embodiment. The electronic package 640 may comprise a package substrate 641 and a die 642 over the package substrate. While a single die 642 is shown, it is to be appreciated that the electronic package 640 may be a multi-chip package in some embodiments. In an embodiment, a spray chamber 644 is disposed over the die 642. A spray chamber housing may be secured against the package substrate 641 by an attachment structure 647. The attachment structures 647 may form a hermetic seal. The spray chamber 644 may have an interior volume 643.

In an embodiment, a working fluid 646 may be dispensed into the interior volume 643 through a nozzle 645 of the spray chamber 644. While two nozzles 645 are shown, it is to be appreciated that any number of nozzles 645 (e.g., one or more) may spray the working fluid 646 into the interior volume 643. In some embodiments, the nozzles 645 are atomizers in order to provide a fine misting of the working fluid 646 into the interior volume 643. The nozzles 645 may be arranged in order to provide a uniform spray over the surface of the die 642. The working fluid 646 may enter the nozzles through a fluid input line 648 that is fluidically coupled to a fluid reservoir (not shown).

In an embodiment, the interior volume 643 of the spray chamber 644 is pressure controlled. Particularly, a vapor outlet 639 may be coupled to a vacuum pump (not shown) in order to provide a desired pressure within the spray chamber 644. In some embodiments, the pressure may be below atmospheric pressure. Lowering the pressure results in a reduction of the boiling point of the working fluid 646. As such, when the working fluid 646 is dispensed into the interior volume 643 of the spray chamber 644, it undergoes a rapid phase change (from liquid to gas) and provides a large extraction of thermal energy from the die 642. In an embodiment, the pressure of the interior volume 643 may be controlled to be between approximately 0.05 atm and 2 atm. In order to make the phase change even faster, the working fluid 646 may be heated to a temperature above the boiling point in the low pressure environment.

Since the phase change can occur directly on the die 642 (or on a die lid), there is no additional thermal mass. As such, the temperature control is rapid. Additionally, dry-out is avoided since the working fluid 646 is supplied by a reservoir (which may also recapture the fluid from the vapor line) and constantly replenished. Furthermore, there is a low thermal gradient on the die when using such systems. This is because the areas of higher temperature (i.e., hotspots) will drive a phase change of the working fluid more rapidly.

Figure 6B:
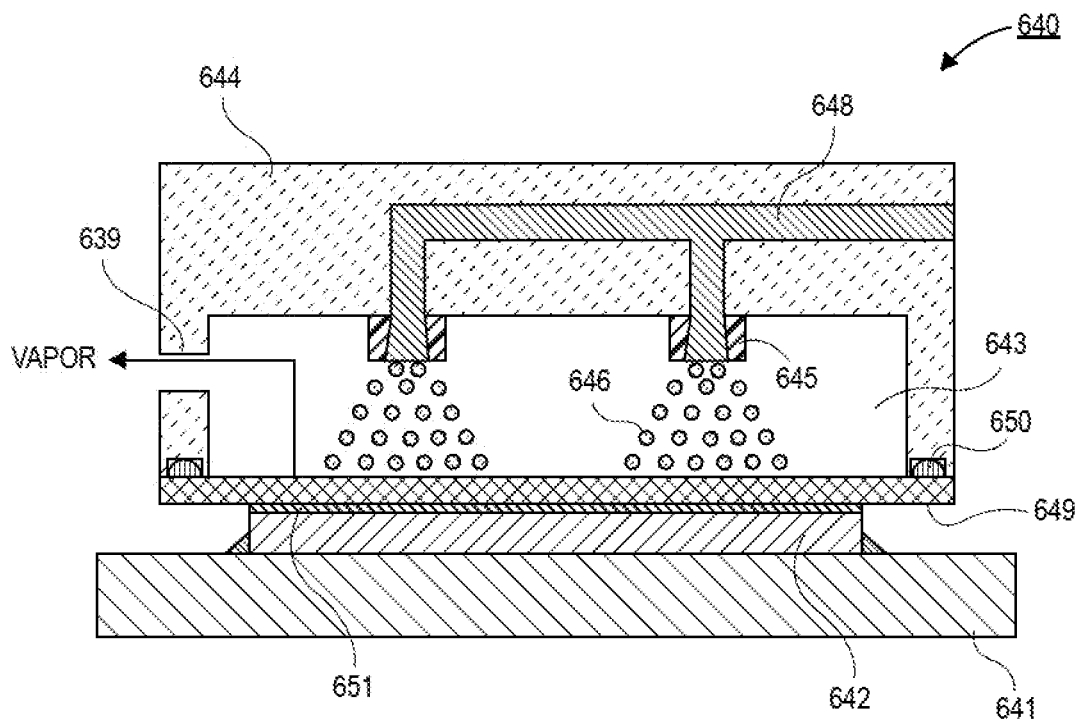
FIG. 6B is a cross-sectional illustration of a die with a thermal plate in a vacuum modulated cooling system, in accordance with an embodiment.

Referring now to FIG. 6B, a cross-sectional illustration of an electronic package 640 is shown, in accordance with an additional embodiment. The electronic package 640 in FIG. 6B may be substantially similar to the electronic package 640 in FIG. 6A, with the exception that a thermal plate 649 is positioned between the die 642 and the spray chamber 644. The thermal plate 649 may be thermally coupled to the die 642 by a thermal interface material (TIM) 651. The spray chamber 644 may be attached to the thermal plate 649 instead of the package substrate 641. A gasket 650 may provide a seal between the thermal plate 649 and the spray chamber 644. At the cost of a larger thermal mass, such an architecture may allow for the die 642 and package substrate 641 to be sealed off from the working fluid 646. Such an embodiment may be particularly useful for die testing and validation applications.

Figure 6C:
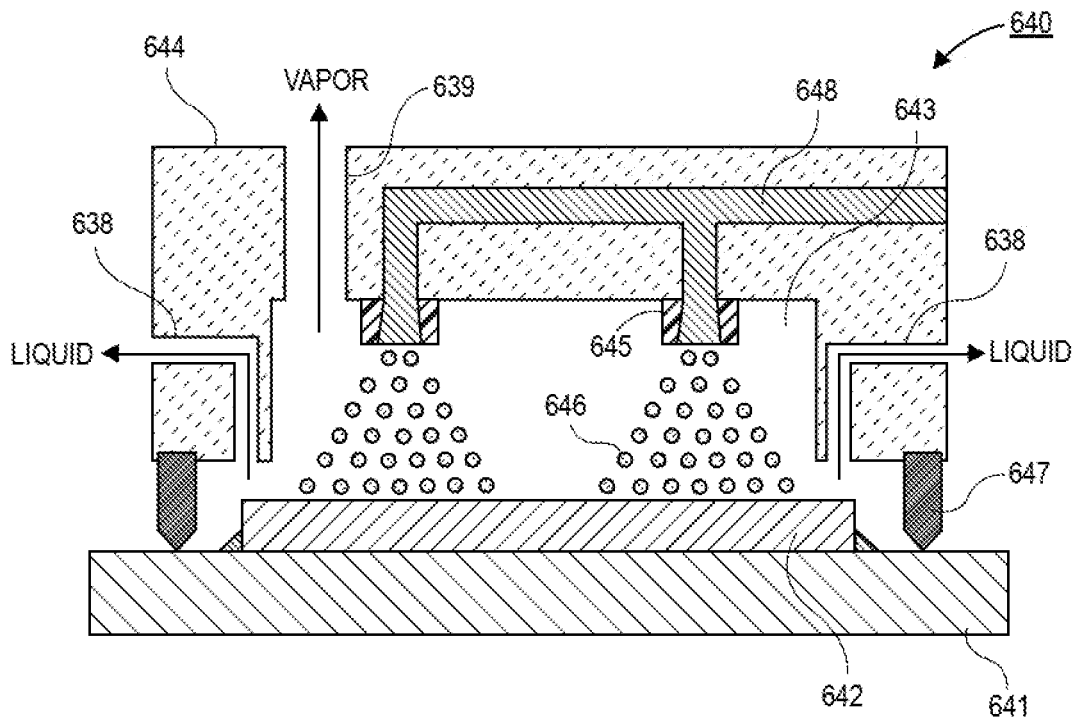
FIG. 6C is a cross-sectional illustration of a die with a vacuum modulated cooling system with liquid exits, in accordance with an embodiment.

Referring now to FIG. 6C, a cross-sectional illustration of an electronic package 640 is shown, in accordance with an additional embodiment. The electronic package 640 may be substantially similar to the electronic package 640 in FIG. 6A, with the exception of one or more an additional fluid exit paths. Particularly, an exit 638 may be provided to remove any residual liquid from the interior volume 643. The exit 638 may be fluidically coupled to an additional vacuum pump (i.e., a different vacuum pump than the one fluidically coupled to the vapor exit 639). Accordingly, if the fluid 646 does not all completely vaporize, then excess fluid will not build up in the electronic package.

Figure 6D:
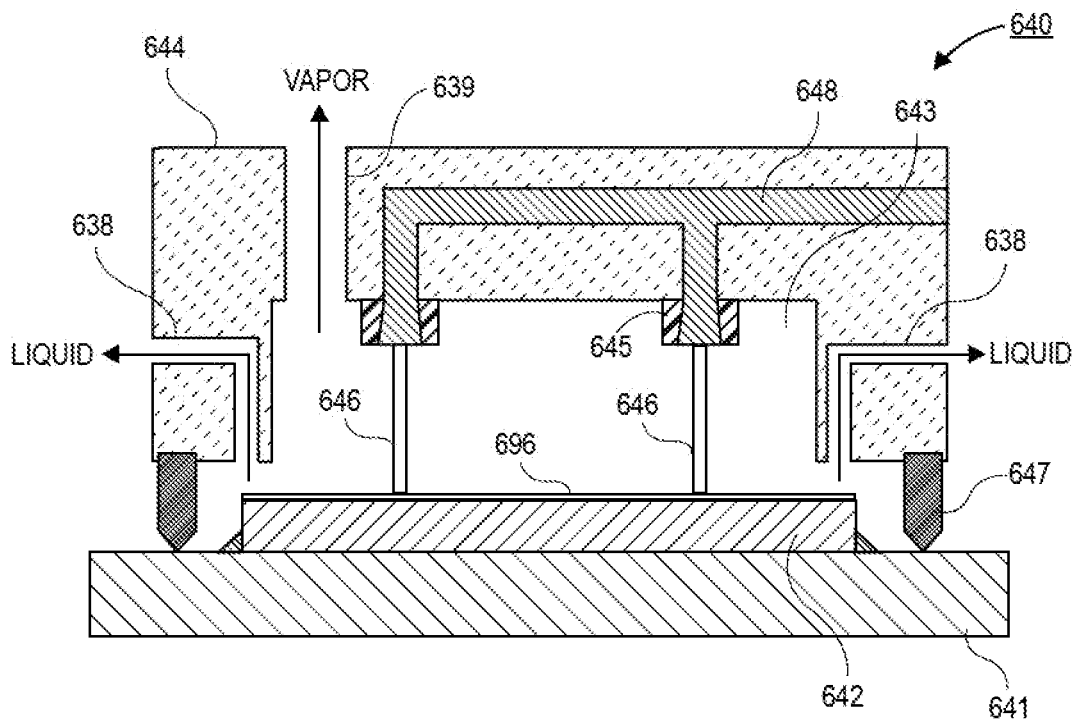
FIG. 6D is a cross-sectional illustration of a die with a vacuum modulated cooling system with a jet impingement architecture, in accordance with an embodiment.

Referring now to FIG. 6D, a cross-sectional illustration of an electronic package 640 is shown, in accordance with an additional embodiment. As shown, the fluid 646 is impinged on the surface of the die 642 via a jet, instead of a spray. After hitting the surface of the die 642 a thin layer 696 spreads across the surface of the die 642.

Figure 6E:
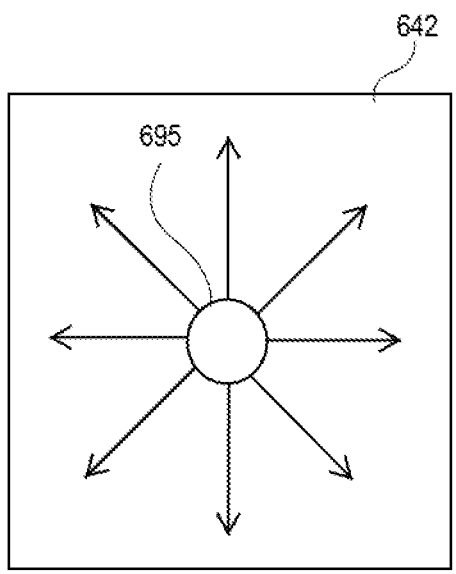
FIG. 6E is a plan view illustration of the die in FIG. 6D that illustrates the spreading of fluid from the impingement point, in accordance with an embodiment.

Referring now to FIG. 6E, a plan view illustration of a die 642 is shown. As shown, the die 642 may be impinged with a jet of fluid at an impingement point 695. From the impingement point 695, the fluid will spread out radially (as indicated by the arrows) via a laminar flow that produces a thin film of fluid on the surface of the die 642. Due to this consistent (but thin) high velocity film, phase change can rapidly occur across the entire surface of the die. If the fluid film is too thick (e.g., so that it pools) or is not replenished instantly after boiling occurs (e.g., so that dry-out occurs) the rate of phase changes is drastically reduced. While a single impingement point 695 is shown, it is to be appreciated that a plurality of impingement points 695 may be used (i.e., by using multiple nozzles). In such embodiments, placement of the nozzles should be selected in order to minimize stagnation zones between impingement points 695. Stagnation zones will result in areas of lower heat-flux, and should therefore be minimized or eliminated completely.

Figure 7A:
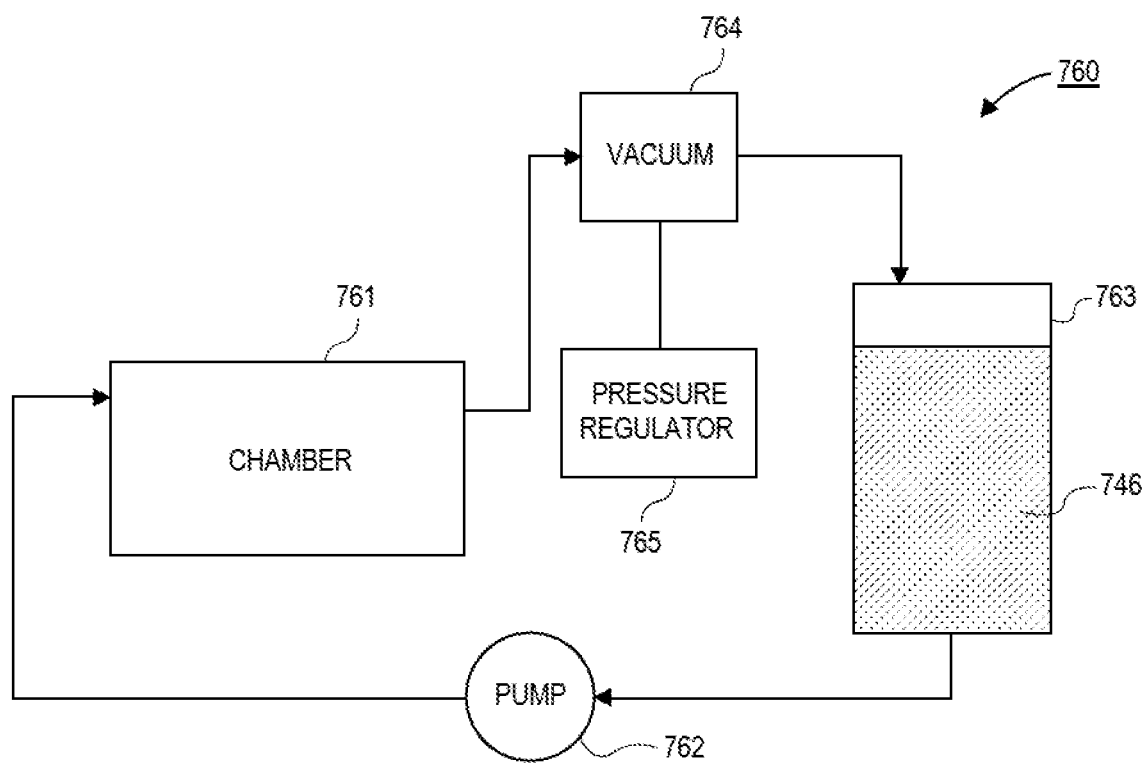
FIG. 7A is a schematic illustration of a vacuum modulated cooling system, in accordance with an embodiment.

Referring now to FIG. 7A, a schematic of a temperature control system 760 is shown, in accordance with an embodiment. The temperature control system 760 may be used in combination with a spray chamber 761 to control the temperature of a die (not shown), in accordance with an embodiment. The spray chamber 761 in FIG. 7A may be similar to any of the electronic packages 640 described above.

In an embodiment, a reservoir 763 is fluidically coupled to the spray chamber 761. A pump 762 may provide a working fluid 746 from the reservoir 763 to the spray chamber 761. After the working fluid 746 undergoes a phase change in the spray chamber 761, it is evacuated from the spray chamber through a vacuum pump 764 that is fluidically coupled to the spray chamber 761. The vacuum pump 764 may be controlled by a pressure regulator 765. The vacuum pump 764 sets a pressure in the spray chamber 761 that enables a rapid phase change of the working fluid 746. After passing the vacuum pump 764, the working fluid may be condensed and returned to the reservoir for reuse.

Figure 7B:
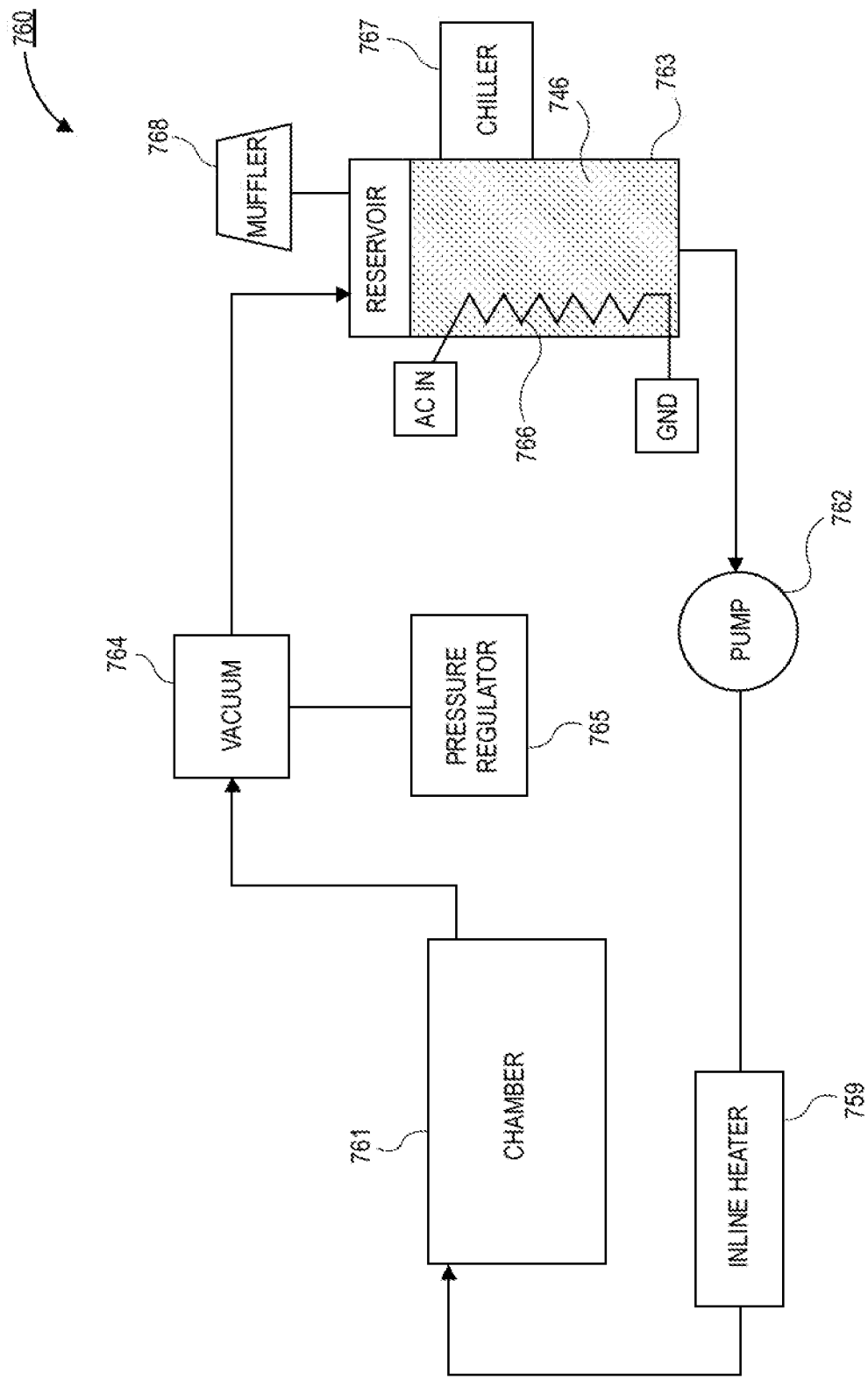
FIG. 7B is a schematic illustration of a vacuum modulated cooling system, in accordance with an additional embodiment.

Referring now to FIG. 7B, a schematic of a temperature control system 760 is shown, in accordance with an additional embodiment. The temperature control system 760 in FIG. 7B is substantially similar to the temperature control system 760 in FIG. 7A, with the exception of the addition of several features. For example, the temperature control system 760 may comprise heating and cooling systems for the reservoir 763. Particularly, the reservoir 763 may comprise a heater 766 and a cooling system, such as a chiller 767. In some embodiments a muffler 768 may be attached to the reservoir 763 to vent air from the reservoir 763 as well. In some embodiments, the fluid line between the reservoir 763 and the spray chamber 761 may also comprise an inline heater or cooler 759 in order to ensure the fluid entering the spray chamber 761 is at the proper temperature.

Figure 7C:
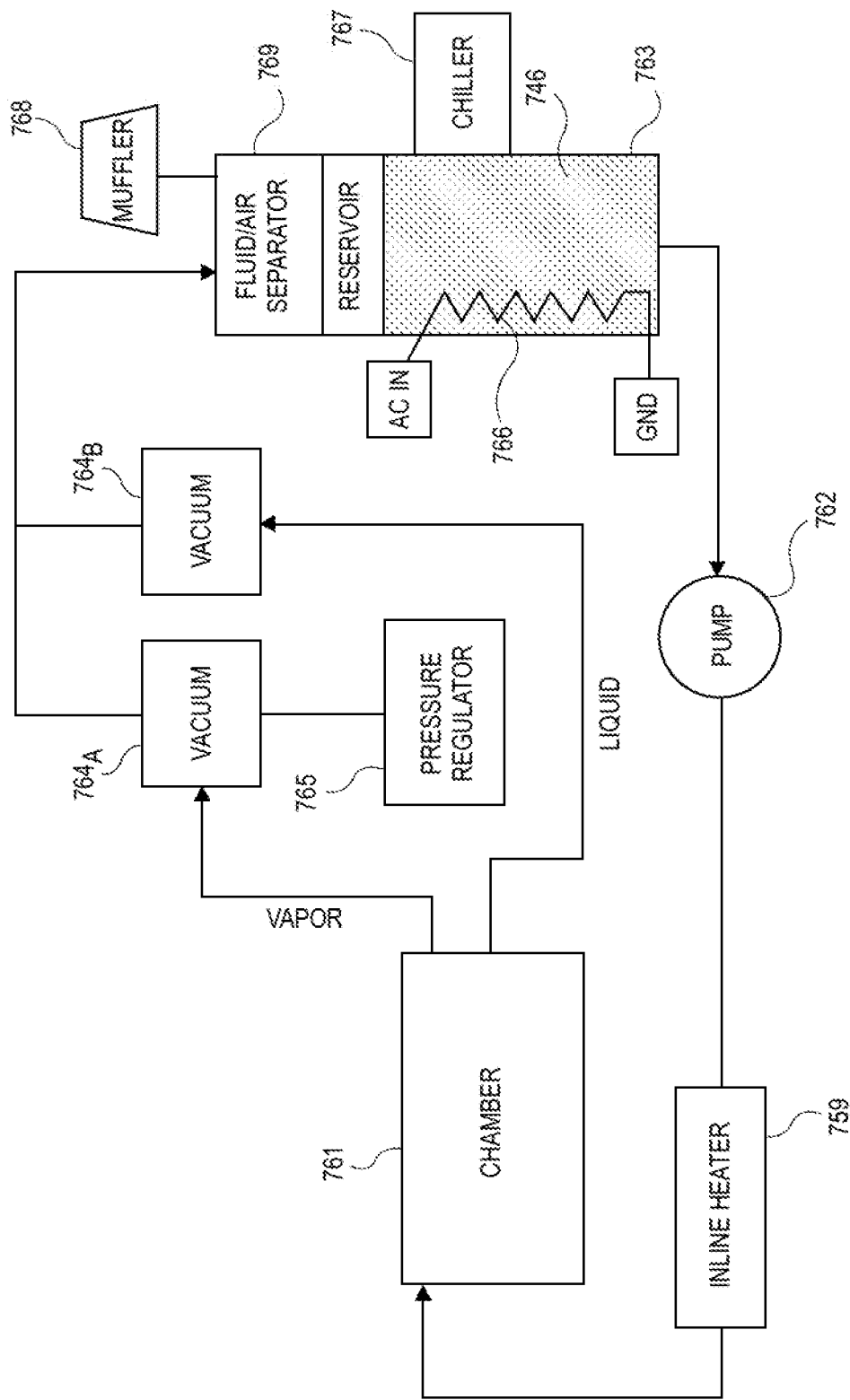
FIG. 7C is a schematic illustration of a vacuum modulated cooling system, in accordance with an additional embodiment.

Referring now to FIG. 7C, a schematic of a temperature control system 760 is shown, in accordance with an additional embodiment. The temperature control system 760 in FIG. 7C may be substantially similar to the temperature control system 760 in FIG. 7B, with the addition of an extra fluid line from the spray chamber 761. Particularly, the first vacuum $764_A$ may pull vapor from the spray chamber 761 and set the pressure within the spray chamber 761. The first vacuum $764_A$ may be controlled by a pressure regulator 765 in order to modulate the pressure within the spray chamber 761. The second vacuum $764_B$ may pull residual liquid from the spray chamber 761 (i.e., similar to the embodiment shown in FIG. 6C). The second vacuum $764_B$ may not be actively controlled in some embodiments, or the second vacuum $764_B$ may be controlled similar to the first vacuum $764_A$. In an embodiment, the absolute pressure from the second vacuum $764_B$ may be lower than that of the first vacuum $764_A$. For example, the first vacuum $764_A$ may generate an absolute pressure between approximately 0.05 atm and approximately 2.0 atm, and the second vacuum $764_B$ may generate an absolute pressure between approximately 0.05 atm and approximately 0.1 atm.

In an embodiment, the temperature control system 760 may also comprise a fluid/air separator 769. The fluid/air separator 769 may be coupled to the muffler 768 in order to vent the air while recapturing the fluid 746 in the reservoir 763.

In FIGS. 7A-7C it is to be appreciated that the schematics have been simplified in order to not obscure aspects of various embodiments. It is to be appreciated that temperature control systems 760 may also comprise various flow control valves, pressure gauges, temperature sensors, or fluid level sensors in order to execute various temperature control processes, such as those described herein.

Figure 8:
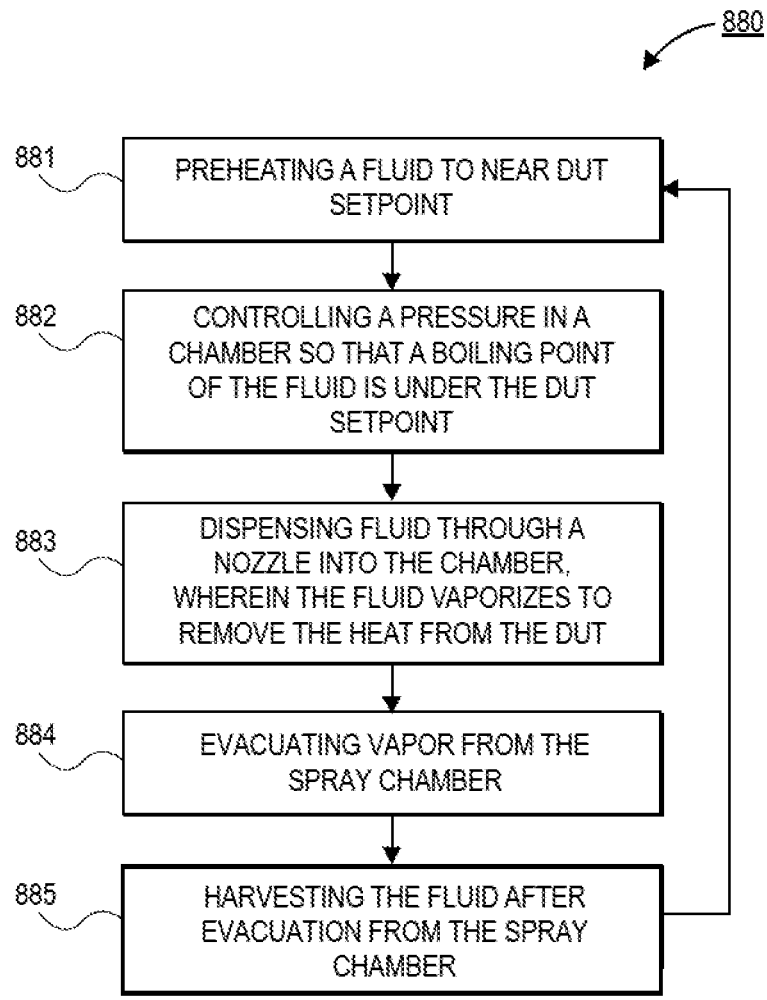
FIG. 8 is a process flow diagram of a process for controlling the temperature of a die, in accordance with an embodiment.

Referring now to FIG. 8, a process flow diagram illustrating a process 880 for temperature control of a die (i.e., a DUT) is shown, in accordance with an embodiment. The process 880 may be implemented using any of the temperature control systems 760 described above.

In an embodiment, process 880 begins with operation 881, which comprises preheating a fluid to near a DUT setpoint. In an embodiment, the temperature of the fluid may be controlled within the reservoir and/or using an inline heater between the reservoir and the spray chamber.

In an embodiment, process 880 continues with operation 882, which comprises controlling a pressure in a spray chamber so that a boiling point of the fluid is at or below the DUT setpoint. The pressure may be reduced below atmospheric pressure using a vacuum pump or the like that is fluidically coupled to the spray chamber.

In an embodiment, process 880 continues with operation 883, which comprises dispensing fluid through a nozzle into the spray chamber wherein the fluid vaporizes to remove the heat from the DUT. In an embodiment, the fluid is rapidly vaporized due to the temperature of the fluid being at or above the boiling temperature within the spray chamber. The rapid phase change allows for heat to be efficiently removed from the DUT.

In an embodiment, process 880 continues with operation 884, which comprises evacuating vapor from the spray chamber. The vapor may be evacuated using a vacuum pump or the like. In some embodiments, residual fluid may also be removed using fluid exit lines, such as those shown in FIGS. 6C and 7C.

In an embodiment, process 880 continues with operation 885, which comprises harvesting the fluid after evacuation from the spray chamber. In an embodiment, the vapor is condensed to return it to a fluid phase that can be returned to the reservoir. The condensation may occur before reaching the reservoir or at the reservoir.

Figure 9:
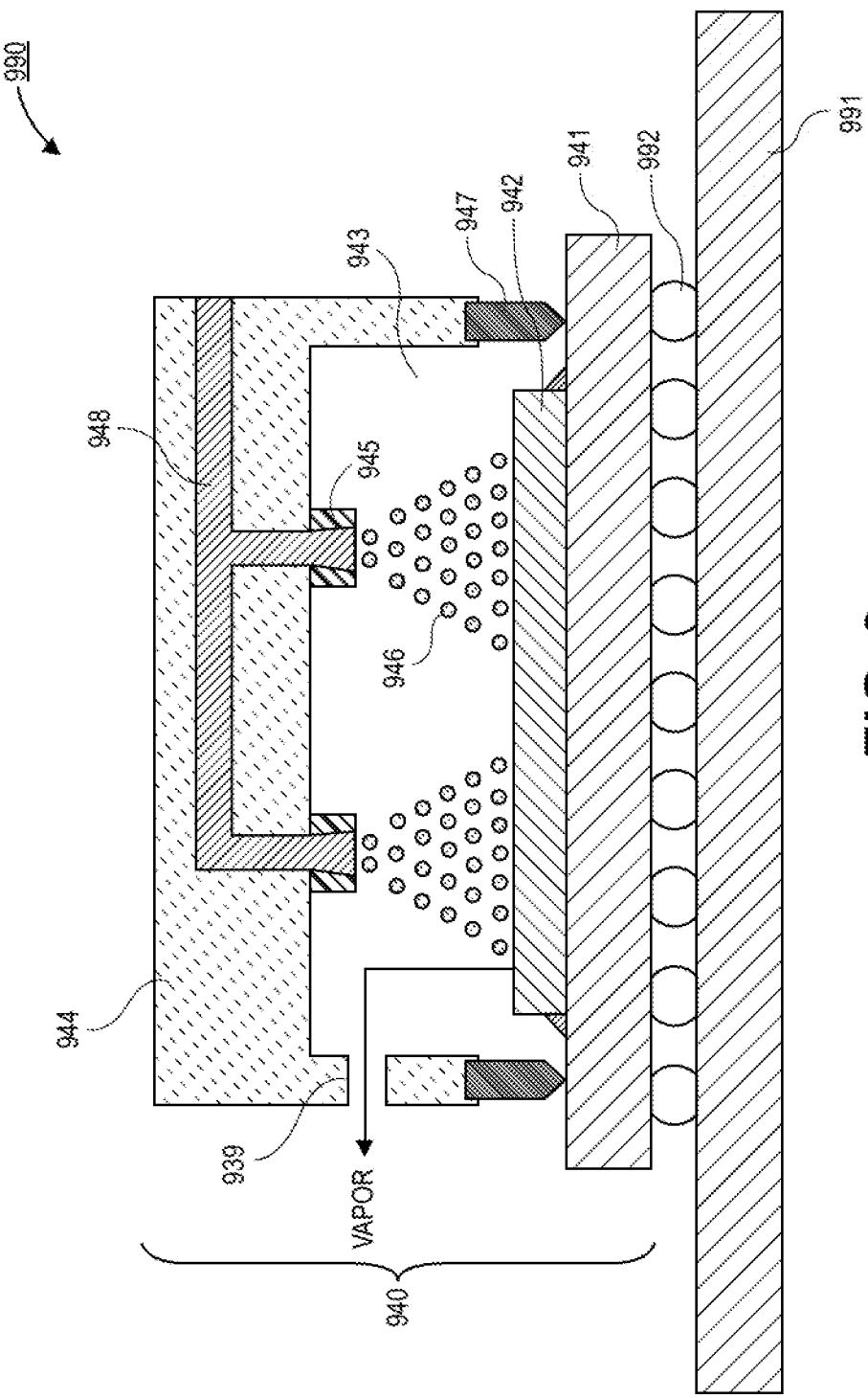
FIG. 9 is a cross-sectional illustration of an electronic system that comprises a vacuum modulated cooling system, in accordance with an embodiment.

Referring now to FIG. 9, a cross-sectional illustration of an electronic system 990 is shown, in accordance with an embodiment. In an embodiment, the electronic system 990 comprises a board 991 and an electronic package substrate 940 attached to the board by interconnects 992. The interconnects 992 are shown as solder bumps, but any interconnect architecture (e.g., wire bonds, sockets, etc.) may be used to connect the electronic package 940 to the board 991.

In an embodiment, the electronic package 940 comprises a package substrate 941 and a die 942. A spray chamber 944 may be disposed over the die 942. The spray chamber 944 may have a fluid inlet 948 and one or more nozzles 945 for dispensing fluid 946 over the die 942. In an embodiment, an outlet 939 through the spray chamber 944 is provided for removing vapor (and for controlling pressure within an interior volume 943 of the spray chamber 944). The spray chamber 944 may be sealed against the package substrate with attachment structures 947.

In an embodiment, the electronic package 940 is substantially similar to the electronic package 640 in FIG. 6A. However, it is to be appreciated that the electronic package 940 may be substantially similar to any of the electronic packages disclosed herein.

Referring now to FIGS. 10A-13B, additional vacuum modulated cooling systems are described in accordance with additional embodiments. The additional cooling systems function substantially similar to the vacuum modulated cooling systems described above. That is, the pressure in a spray chamber may be below atmospheric pressure. Lowering the pressure results in a reduction of the boiling point of the working fluid. As such, when the working fluid is dispensed into the interior volume of the spray chamber, it undergoes a rapid phase change (from liquid to gas) and provides a large extraction of thermal energy from the die. In order to make the phase change even faster, the working fluid may be heated to a temperature above the boiling point in the low pressure environment.

However, the embodiments described with respect to FIGS. 10A-13B include alternative topologies that allow for improvements to the vacuum modulated cooling system. In first embodiments (illustrated in FIGS. 10A-11) the vacuum source is moved so that the reservoir is between the vacuum source and the spray chamber, instead of having the vacuum source between the spray chamber and the reservoir. As used herein, when a component is referred to as being "between" other components, it refers to the relative positions along a temperature control loop. For example, a first component that is "between" a second component and a third component may not necessarily be physically between the second component and the third component, so long as the fluid path of the temperature control loop passes through (or past) the first component before reaching the third component.

Accordingly, the working fluid (in either a gas or liquid state) does not need to pass through the vacuum source prior to reaching the reservoir. Passing the working fluid through the vacuum source may lead to throttling issues that limits the maximum cooling potential of the loop since low pressure regimes (e.g., less than approximately 0.3 atm) become unstable. In an embodiment, the flow rate of the working fluid is increased and the minimum stable pressure in the spray chamber is lowered by moving the vacuum source so that the reservoir is between the vacuum source and the spray chamber. As such, the cooling potential is significantly improved.

Figure 12A:
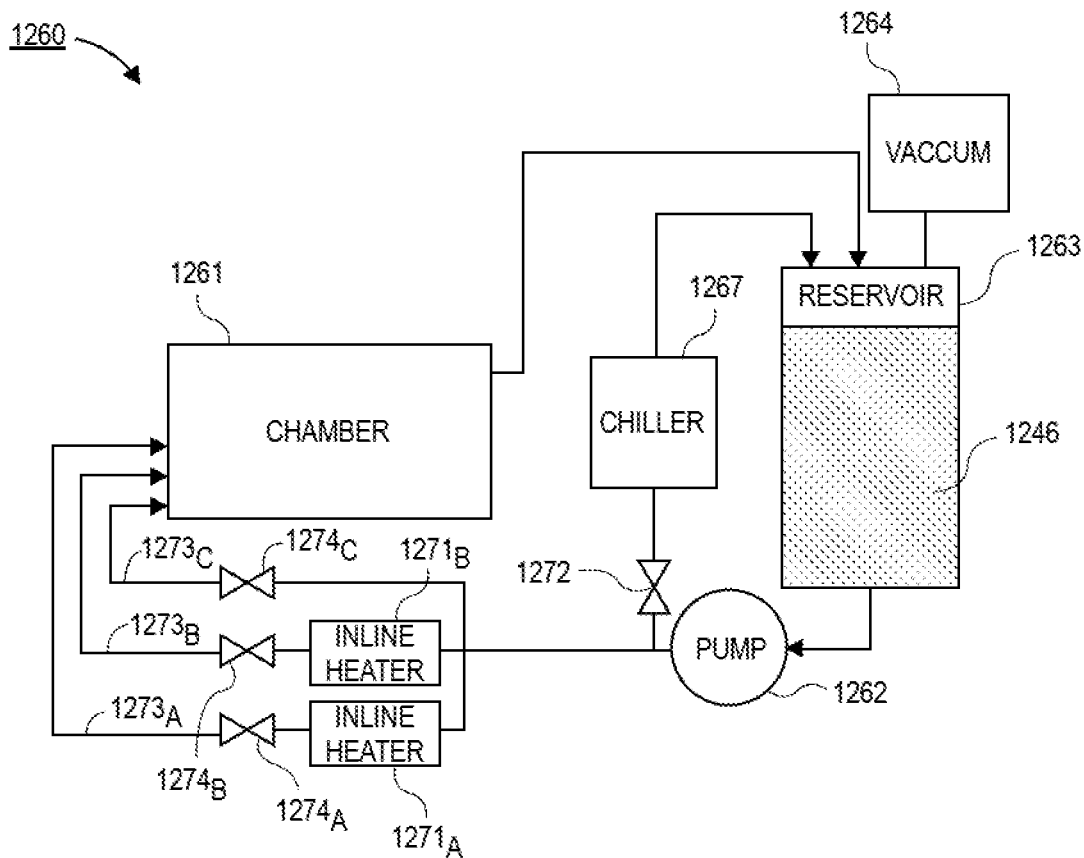
FIG. 12A is a schematic illustration of a vacuum modulated cooling system with a plurality of inlet lines to a spray chamber, in accordance with an embodiment.
Figure 12B:
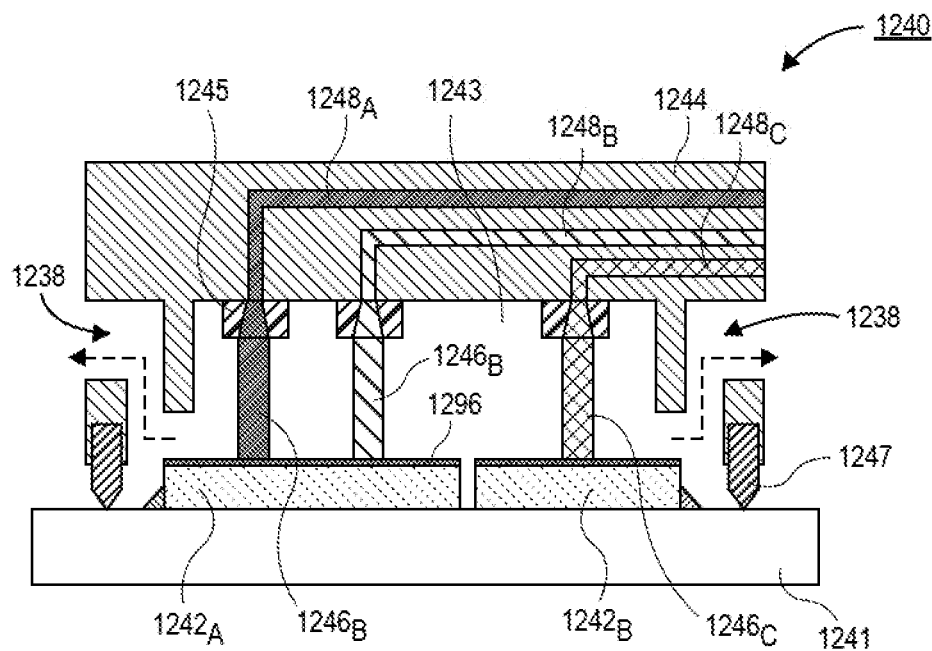
FIG. 12B is a cross-sectional illustration of an electronic system that comprises a vacuum modulated cooling system with a plurality of fluid inputs, in accordance with an embodiment.
Figure 12C:
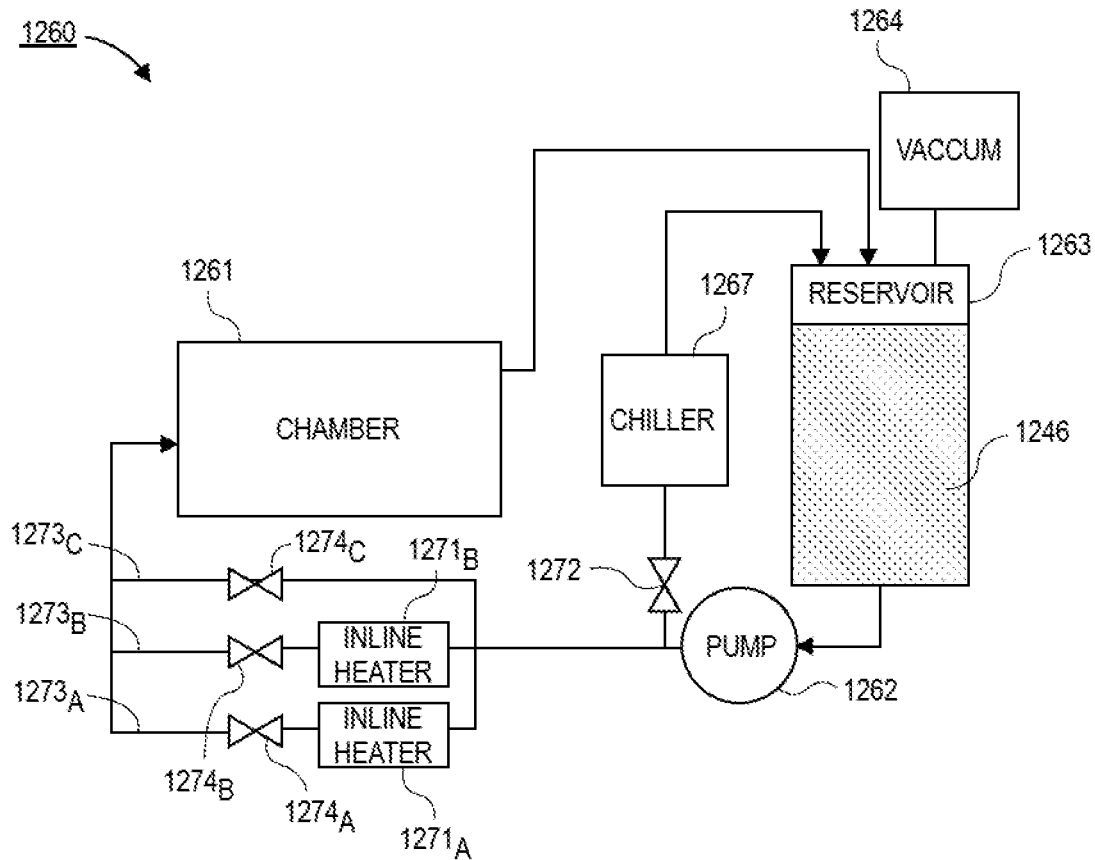
FIG. 12C is a schematic illustration of a vacuum modulated cooling system with a plurality of inlet lines that couple into a single fluid input to a spray chamber, in accordance with an embodiment.

In other embodiments, such as those illustrated in FIGS. 12A-12C, a plurality of fluid input lines are provided into the spray chamber. The individual fluid input lines may have different temperature set points. As such, dies with a higher thermal output may be cooled at different rates than dies with a lower thermal output. Additionally, different setpoint temperatures may be used to provide cooling at different levels depending on the power consumption of the die. For example, when the die is at a high power consumption mode, a higher setpoint temperature may be used to create a more rapid phase change in order to provide more cooling. At lower power consumption modes, a lower set point temperature fluid may be used since the need for cooling is reduced.

Figure 13A:
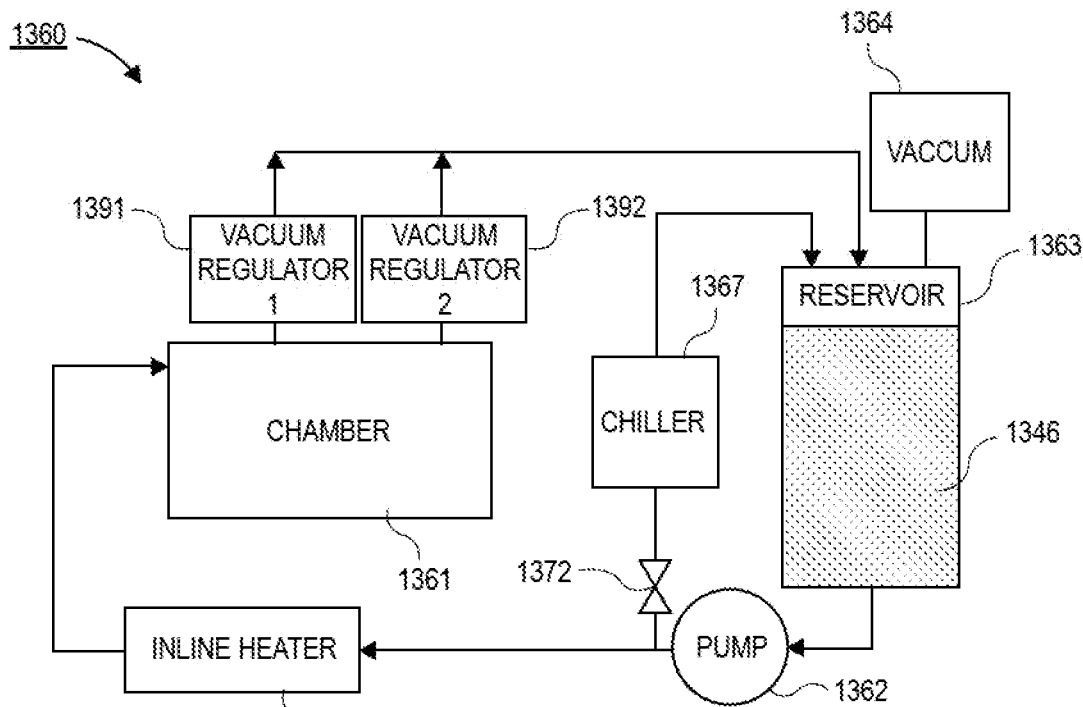
FIG. 13A is a schematic illustration of a vacuum modulated cooling system with a plurality of vacuum regulators, in accordance with an embodiment.

In yet another embodiment, shown in FIGS. 13A and 13C, the spray chamber may be segmented into a plurality of pressure zones. A first pressure zone may be used for high power consumption dies, and a second pressure zone may be used for lower power consumption dies. The pressure in the first pressure zone may be lower than the pressure in the second pressure zone. As such, the phase change occurs more rapidly in the first pressure zone, and therefore, provides more cooling. The pressures in the first pressure zone and the second pressure zone may be regulated by pressure regulators between the spray chamber and the vacuum source.

Figure 10A:
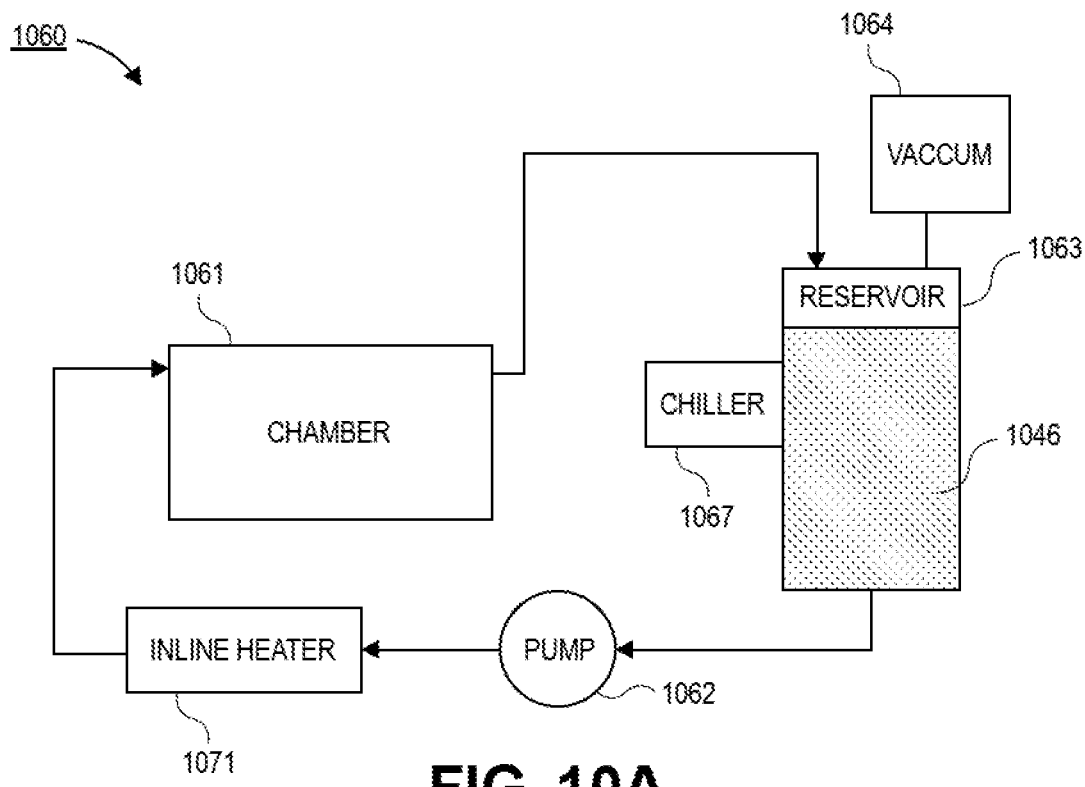
FIG. 10A is a schematic illustration of a vacuum modulated cooling system with a vacuum source coupled to a spray chamber through a reservoir, in accordance with an embodiment.

Referring now to FIG. 10A, a schematic illustration of a temperature control system 1060 is shown, in accordance with an embodiment. In an embodiment, the temperature control system 1060 may comprise a reservoir 1063. The reservoir 1063 may store a working fluid 1046. In an embodiment, the working fluid 1046 may be water or other suitable working fluid 1046, such as fluorinerts. The working fluid 1046 may be actively cooled by a chiller 1067, or the like. In an embodiment, a pump 1062 pushes working fluid 1046 from the reservoir 1063 to a spray chamber 1061. An inline heater 1071 may be provided along the fluid path between the pump 1062 and the spray chamber 1061. The inline heater 1071 may increase the temperature of the working fluid 1046 to a setpoint temperature above the boiling point of the working fluid in a reduced pressure environment.

In an embodiment, the spray chamber 1061 may be a chamber with a pressure that is below atmospheric pressure. For example, the pressure within the spray chamber 1061 may be between approximately 0.05 atm and approximately 1.0 atm. The vacuum pressure within the spray chamber 1061 may be supplied by a vacuum source 1064. As opposed to the embodiments described above, the vacuum source 1064 is provided after the reservoir 1063. Therefore, the working fluid 1046 does not need to pass through the vacuum source 1064 on its way back to the reservoir 1063.

Since the working fluid 1046 does not pass through the vacuum source 1064, lower pressures in the spray chamber 1061 and higher working fluid 1046 flow rates can be achieved. Particularly, the working fluid 1046 flow rate is now dependent on the pumping power and the nozzles in the spray chamber 1061. For example, the working fluid 1046 flow rate may be approximately 300 mL per minute or higher, or approximately 400 mL per minute or higher. This is significantly higher than the approximately 50 mL per minute flow rate provided when the vacuum source 1064 is between the spray chamber 1061 and the reservoir 1063. Furthermore the flow rate of the working fluid 1046 is steady across different vacuum pressures.

Additionally, a single fluid outlet from the spray chamber 1061 is provided in some embodiments. That is, liquid and vapor are pulled out the same outlet of the spray chamber 1061. This allows for utilization of the full range of pressures supplied by the vacuum source 1064 since a separate pressure level is not needed to withdraw the liquid from the spray chamber. For example, when separate outlets are used for the liquid and vapor, removal of the liquid requires a pressure of approximately 0.1 atm. Lower pressures were therefore, not possible. Without the need for two separate outlets, pressures down to approximately 0.05 atm are possible. The decreased minimum pressure allows for dramatically improving the cooling capability by further shifting the temperature saturation point to lower temperatures which are much more applicable to certain operating conditions (e.g., OEM operating conditions).

Figure 10B:
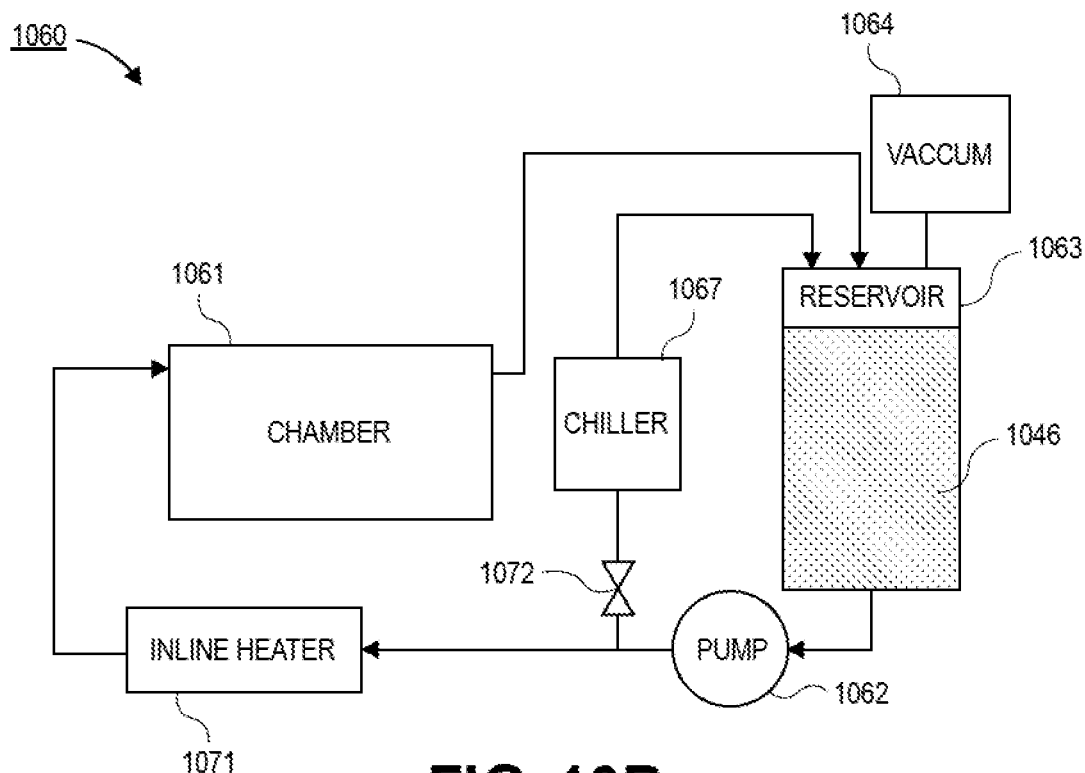
FIG. 10B is a schematic illustration of a vacuum modulated cooling system with an external chiller, in accordance with an embodiment.

Referring now to FIG. 10B, a schematic illustration of a temperature control system 1060 is shown, in accordance with an additional embodiment. The temperature control system 1060 in FIG. 10B is substantially similar to the temperature control system 1060 in FIG. 10A, with the exception that the chiller 1067 is now external to the reservoir 1063. In an embodiment, the chiller 1067 may be a radiator or the like. The chiller 1067 may have an inlet that connects to a line between the pump 1062 and the spray chamber 1061 and an outlet that feeds back into the reservoir 1063. Control of fluid flow into the chiller 1067 may be provided by a valve 1072. Moving the chiller input to the other side of the pump 1062 allows for the pump 1062 to also drive flow into the chiller 1067. As such, a dedicated pump is not needed, and power efficiency of the temperature control system 1060 is improved.

Figure 10C:
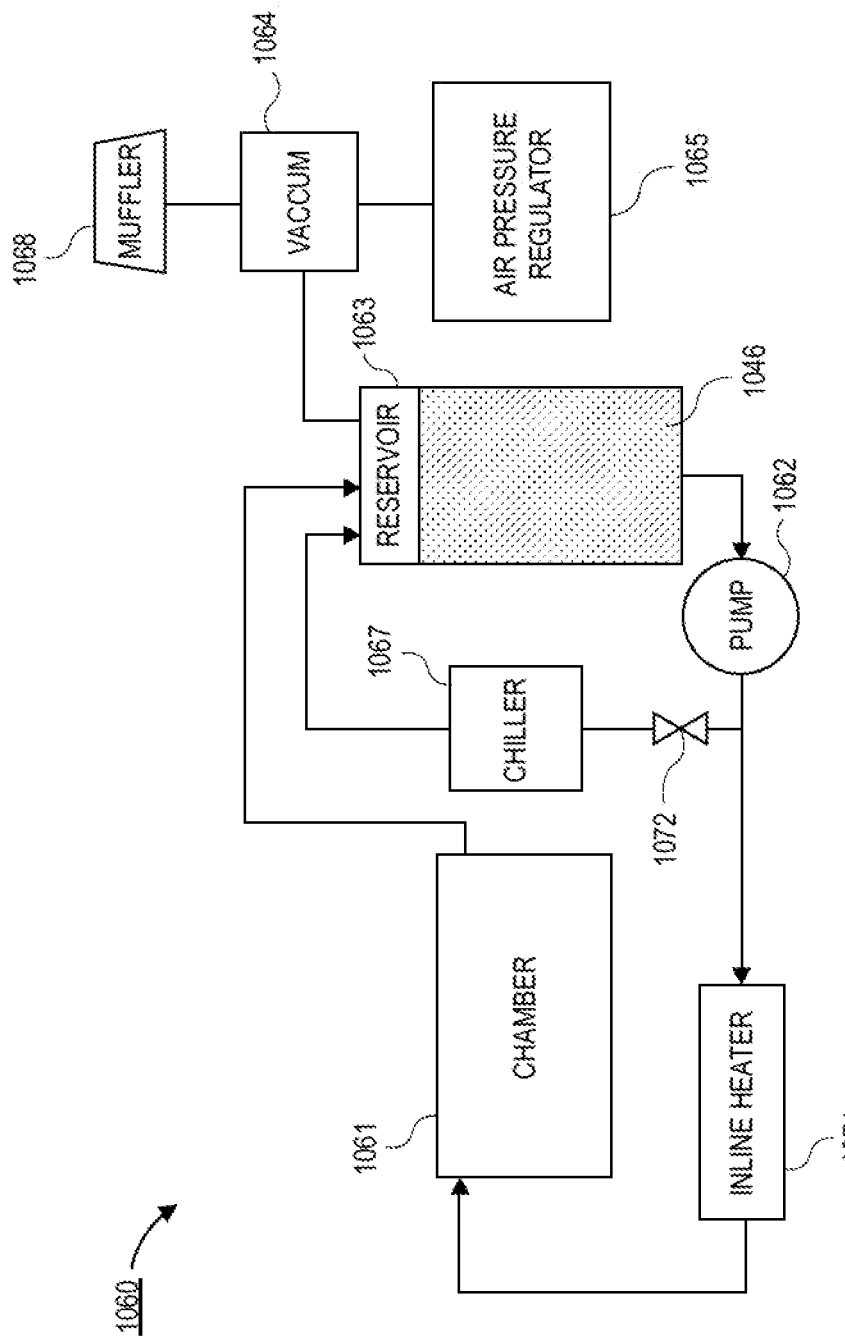
FIG. 10C is a schematic illustration of a vacuum modulated cooling system with a pressure regulated vacuum source and a muffler, in accordance with an embodiment.

Referring now to FIG. 10C, a schematic illustration of a temperature control system 1060 is shown, in accordance with an additional embodiment. The temperature control system 1060 in FIG. 10C is substantially similar to the temperature control system 1060 in FIG. 10B, with the exception of the inclusion of a pressure regulator 1065 and a muffler 1068 attached to the vacuum source 1064. Such an embodiment allows for the vacuum source 1064 to be a controllable vacuum generator. This allows for rapid adjustment of pressure inside the loop while maintaining reliable operation.

Figure 11:
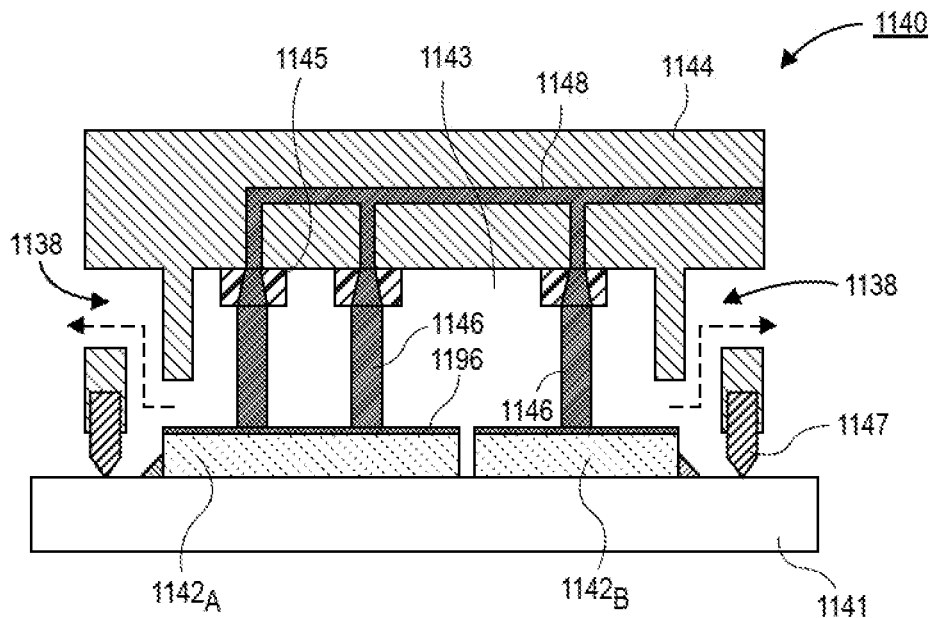
FIG. 11 is a cross-sectional illustration of an electronic system that comprises a vacuum modulated cooling system, in accordance with an embodiment.

Referring now to FIG. 11, a cross-sectional illustration of an electronic package 1140 is shown, in accordance with an embodiment. The electronic package 1140 may comprise a package substrate 1141 and one or more dies $1142_A$ and $1142_B$ over the package substrate 1141. While a pair of dies $1142_A$ and $1142_B$ are shown, it is to be appreciated that the electronic package 1140 may include any number of dies 1142. In an embodiment, a spray chamber 1144 is disposed over the dies $1142_A$ and $1142_B$. A spray chamber housing may be secured against the package substrate 1141 by an attachment structure 1147. The attachment structures 1147 may form a hermetic seal. The spray chamber 1144 may have an interior volume 1143.

In an embodiment, a working fluid 1146 may be dispensed into the interior volume 1143 through a nozzle 1145 of the spray chamber 1144. While three nozzles 1145 are shown, it is to be appreciated that any number of nozzles 1145 (e.g., one or more) may spray the working fluid 1146 into the interior volume 1143. In some embodiments, the nozzles 1145 provide a jet of the working fluid 1146 that impinges a surface of the dies $1142_A$ and $1142_B$. After hitting the surface of the dies $1142_A$ and $1142_B$ a thin layer 1196 spreads across the surface of the dies $1142_A$ and $1142_B$. In other embodiments, the nozzles 1145 are atomizers in order to provide a fine misting of the working fluid 1146 into the interior volume 1143. The working fluid 1146 may enter the nozzles through a fluid input line 1148 that is fluidically coupled to a fluid reservoir (not shown).

In an embodiment, the interior volume 1143 of the spray chamber 1144 is pressure controlled. Particularly, an outlet 1138 may be coupled to a vacuum source (not shown) in order to provide a desired pressure within the spray chamber 1144. In some embodiments, the pressure may be below atmospheric pressure. Lowering the pressure results in a reduction of the boiling point of the working fluid 1146. As such, when the working fluid 1146 is dispensed into the interior volume 1143 of the spray chamber 1144, it undergoes a rapid phase change (from liquid to gas) and provides a large extraction of thermal energy from the dies $1142_A$ and $1142_B$. In an embodiment, the pressure of the interior volume 1143 may be controlled to be between approximately 0.05 atm and 1 atm. In order to make the phase change even faster, the working fluid 1146 may be heated to a temperature above the boiling point in the low pressure environment.

Since the phase change can occur directly on the dies $1142_A$ and $1142_B$ (or on a die lids), there is no additional thermal mass. As such, the temperature control is rapid. Additionally, dry-out is avoided since the working fluid 1146 is supplied by a reservoir (which may also recapture the fluid from the vapor line) and constantly replenished. Furthermore, there is a low thermal gradient on the die when using such systems. This because the areas of higher temperature (i.e., hotspots) will drive a phase change of the working fluid more rapidly. In an embodiment, the working fluid 1146 is sprayed on the dies 1142 and creates a uniform film 1196 of the working fluid 1146 across the dies 1142. Any fluid that vaporizes is instantly replenished by the uniform film 1196. This is an improvement over micro-channel architectures, where bubbles can potentially vapor-lock the system.

Referring now to FIG. 12A, a schematic illustration of a temperature control system 1260 is shown, in accordance with an embodiment. In an embodiment, the temperature control system 1260 comprises a reservoir 1263 for holding a working fluid 1246. A pump 1242 provides working fluid 1246 from the reservoir 1263 to a spray chamber 1261. A valve 1272 for a chiller 1267 may be on the opposite side of the pump 1262 from the reservoir 1263. In an embodiment, a vacuum source 1264 may be provided with the reservoir 1263 between the vacuum source 1264 and the spray chamber 1261.

As shown in FIG. 12A, a plurality of inlets 1273$_{A-C}$ are provided into the spray chamber 1261. Fluid flow through the plurality of inlets 1273 may be controlled by valves 1274$_{A-C}$. In an embodiment, each inlet 1273 may be have a different setpoint temperature. For example, one or more of the inlets 1273 may further include an inline heater 1271$_A$ or 1271$_B$. One or more of the inlets 1273 may not include an inline heater 1271. For example, inlet 1273$_C$ does not include an inline heater 1271.

Providing different temperature set points allows for improved control of the cooling within the spray chamber 1261. Particularly, working fluid 1246 may have a higher setpoint temperature for regions of the one or more dies that are operating at higher power, and therefore, need additional cooling. In contrast, low power regions of the one or more dies may not require the same, relatively high, cooling effort, and a lower temperature working fluid is sufficient.

In the particular embodiment illustrated in FIG. 12A, three inlets 1273$_{A-C}$ are provided. In an embodiment, a first inlet 1273$_A$ may have a first temperature setpoint that is above the saturation temperature. The saturation temperature may refer to the boiling point temperature of the working fluid 1246 at the pressure (e.g., 0.05 atm to 1.0 atm) within the spray chamber. In an embodiment, a second inlet 1273$_B$ may have a second temperature setpoint that is approximately equal to the saturation temperature. In an embodiment, a third inlet 1273$_C$ may have a third temperature setpoint that is below the saturation temperature. That is, the third temperature setpoint may be suitable for one phase cooling. Fluid provided to the spray chamber 1261 may be controlled by valves 1274$_{A-C}$. In an embodiment, the valves 1274$_A$ and 1274$_B$ may be provided after the inline heaters 1271$_A$ and 1271$_B$ so that the valves 1274$_A$ and 1274$_B$ are between the spray chamber 1261 and the inline heaters 1271$_A$ and 1271$_B$.

Referring now to FIG. 12B, a cross-sectional illustration of an electronic package 1240 is shown, in accordance with an embodiment. The electronic package 1240 may comprise a package substrate 1241 and one or more dies 1242$_A$ and 1242$_B$ over the package substrate 1241. While a pair of dies 1242$_A$ and 1242$_B$ are shown, it is to be appreciated that the electronic package 1240 may include any number of dies 1242. In an embodiment, a spray chamber 1244 is disposed over the dies 1242$_A$ and 1242$_B$. A spray chamber housing may be secured against the package substrate 1241 by an attachment structure 1247. The attachment structures 1247 may form a hermetic seal. The spray chamber 1244 may have an interior volume 1243. Working fluid (in gas or liquid phase) may be extracted from the interior volume 1243 through exits 1238.

In an embodiment, the working fluid 1246 may be provided to nozzles 1245 through fluid input lines 1248$_{A-C}$. Each fluid input line 1248$_{A-C}$ may be connected to one of the inlets 1273$_{A-C}$ described above. As such, each fluid input line 1248$_{A-C}$ can supply working fluid 1246 at different setpoint temperatures. Such an architecture may be useful when there are known hotspots on the one or more dies 1242. For example, fluid input line 1248$_A$ may be connected to a nozzle 1245 that is positioned over a hotspot. Fluid input line 1248$_C$ may be connected to a nozzle 1245 that is over a low power die 1242$_B$. Fluid input line 1248$_B$ may be connected to a nozzle 1245 that is over region of the one or more dies 1242 that runs hotter than the die 1242$_B$, but cooler than the hotspot. After hitting the surface of the dies 1242 a thin layer 1296 spreads across the surface of the dies 1242.

In the embodiments described above with respect to FIGS. 12A and 12B, the nozzles 1245 are fixed to a single fluid line with a single setpoint temperature. However, embodiments are not limited to such configurations. For example, FIG. 12C provides an illustration of a plurality of inlets 1273$_{A-C}$ that enter the spray chamber 1261 at a single input. The temperature flow into the single input can be modulated by controlling the flow through the plurality of inlets 1273$_{A-C}$ using the valves 1274$_{A-C}$. In such an embodiment, all of the nozzles 1245 may be able to dispense high temperature working fluid (e.g., above the saturation temperature), a low temperature working fluid (e.g., below the saturation temperature), or any temperature between the highest setpoint temperature and the lowest setpoint temperature.

Such an embodiment is particularly useful for providing cooling efforts that are dependent on the mode of operation of the one or more dies in the spray chamber 1261. For example, when thermal requirements are relatively modest, a single phase cooling provided by the lowest temperature setpoint (e.g., inlet 1273$_C$) may be sufficient. However, at higher thermal requirements (e.g., when the one or more dies 1242 are running at higher power modes), rapid cooling provided by a phase change may be executed by providing working fluid 1246 from the highest temperature setpoint (e.g., inlet 1273$_A$). The ability to only use the highest temperature setpoint at times of need allows for an improvement in the power efficiency of the cooling system 1260.

Referring now to FIG. 13A, a schematic illustration of a temperature control system 1360 is shown, in accordance with another embodiment. In an embodiment, the temperature control system 1360 comprises a reservoir 1363 for holding a working fluid 1346. A pump 1362 provides working fluid 1346 from the reservoir 1363 to a spray chamber 1361. An inline heater 1371 may be provided between the pump 1362 and the spray chamber 1361. A valve 1372 for a chiller 1367 may be on the opposite side of the pump 1362 from the reservoir 1363. In an embodiment, a vacuum source 1364 may be provided with the reservoir 1363 between the vacuum source 1364 and the spray chamber 1361.

In an embodiment, a plurality of vacuum regulators 1391 and 1392 may be fluidically coupled to the spray chamber 1361. The vacuum regulators 1391 and 1392 may be positioned between the spray chamber 1361 and the vacuum source 1364. The vacuum regulators 1391 allow for a plurality of different pressure levels to be set within the spray chamber 1361. Setting different pressure levels allows for a control of the cooling effort applied to dies within the different pressure regions of the spray chamber 1361. Particularly, a first pressure region with a first pressure will result in a higher cooling effort than a second pressure region with a second pressure that is higher than the first pressure. As such, the saturation temperature in the first pressure region is reduced compared to the saturation temperature in the second pressure region. Placing high powered devices in the first pressure region and low powered devices in the second pressure region will result in a more energy efficient cooling of the various dies in the system.

Figure 13B:
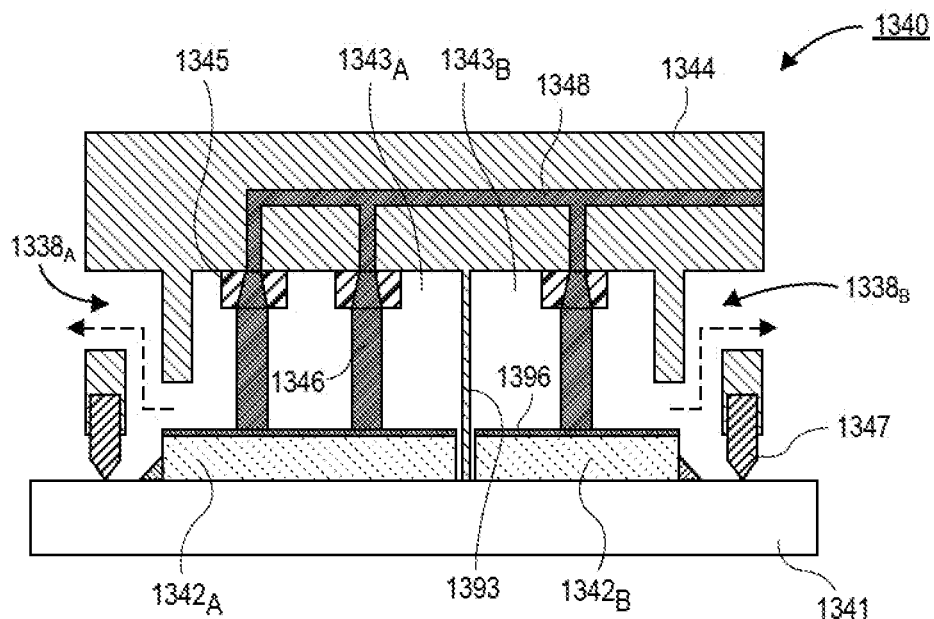
FIG. 13B is a cross-sectional illustration of an electronic system that comprises a vacuum modulated cooling system with a first pressure region and a second pressure region, in accordance with an embodiment.

Referring now to FIG. 13B, a cross-sectional illustration of an electronic package 1340 is shown, in accordance with an embodiment. The electronic package 1340 may comprise a package substrate 1341 and one or more dies $1342_A$ and $1342_B$ over the package substrate 1341. While a pair of dies $1342_A$ and $1342_B$ are shown, it is to be appreciated that the electronic package 1340 may include any number of dies 1342. In an embodiment, a spray chamber 1344 is disposed over the dies $1342_A$ and $1342_B$. A spray chamber housing may be secured against the package substrate 1341 by an attachment structure 1347. The attachment structures 1347 may form a hermetic seal.

In an embodiment, the spray chamber 1344 may have an interior volume 1343 that is separated into a plurality of sub-volumes $1343_A$ and $1343_B$. The different sub-volumes $1343_A$ and $1343_B$ may be separated from each other by one or more dividers 1393. The divider 1393 may form a hermetic seal between the sub-volumes $1343_A$ and $1343_B$. In the illustrated embodiment, the divider 1393 extends down to the package substrate 1341. However, in other embodiments that include a thermal plate over the one or more dies 1342, the divider 1393 may extend down to the thermal plate. Working fluid (in gas or liquid phase) may be extracted from the interior volumes $1343_A$ and $1343_B$ through exits $1338_A$ and $1338_B$, respectively. In an embodiment, exit $1338_A$ may be fluidically coupled to the first vacuum regulator 1391, and exit $1338_B$ may be fluidically coupled to the second vacuum regulator 1392. As such, the interior volumes $1343_A$ and $1343_B$ may be maintained at different pressures.

In the illustrated embodiment, a single fluid inlet 1348 is shown feeding each of the nozzles 1345. However, it is to be appreciated that multiple fluid inlets 1348 may be included, similar to the embodiment described above with respect to FIG. 12B. The nozzles 1345 may provide a jet of working fluid 1346 that impinges a surface of the dies $1342_A$ and $1342_B$. After hitting the surface of the dies $1342_A$ and $1342_B$ a thin layer 1396 spreads across the surface of the dies $1342_A$ and $1342_B$.

Figure 14:
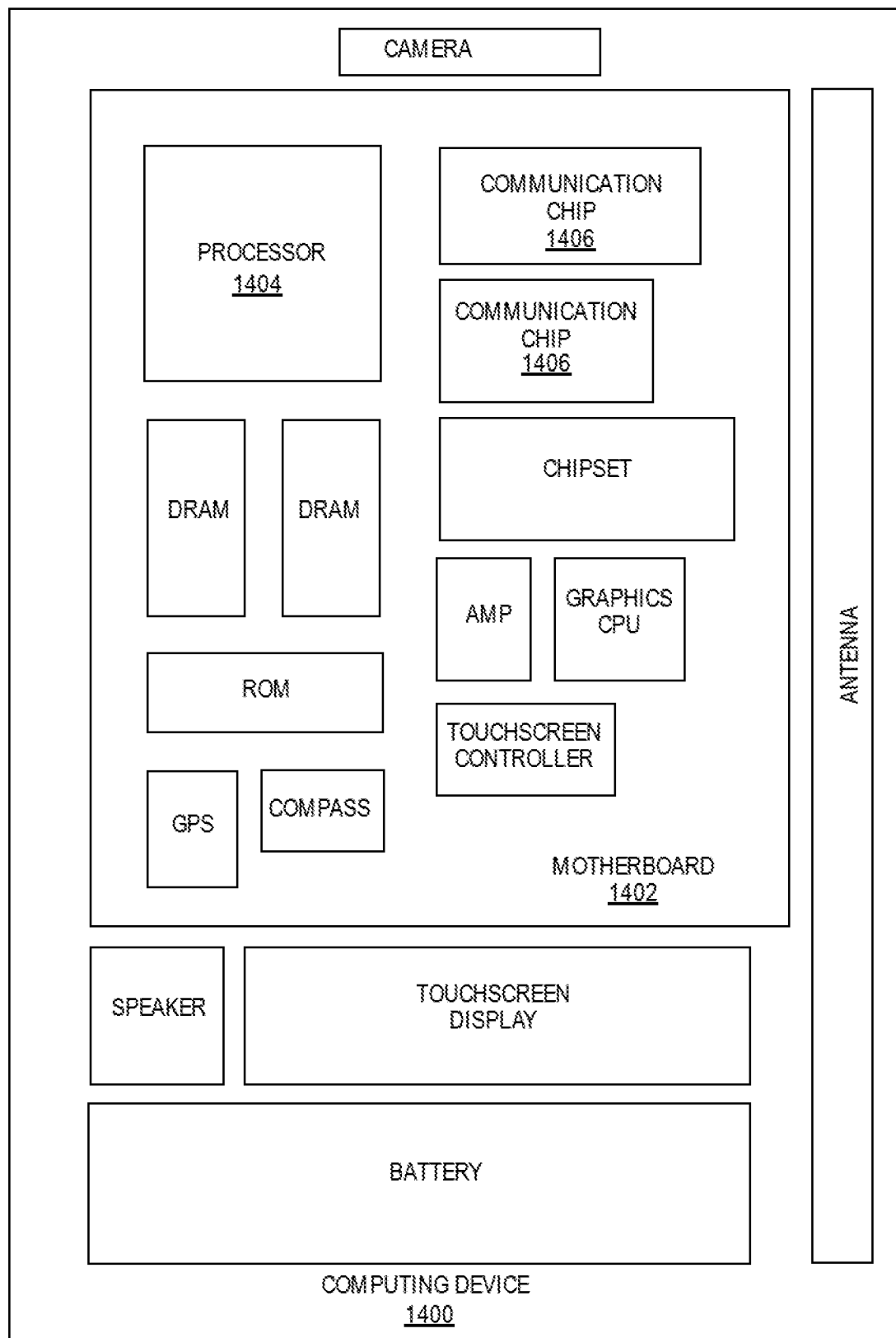
FIG. 14 is a schematic of a computing device built in accordance with an embodiment.

FIG. 14 illustrates a computing device 1400 in accordance with one implementation of the invention. The computing device 1400 houses a board 1402. The board 1402 may include a number of components, including but not limited to a processor 1404 and at least one communication chip 1406. The processor 1404 is physically and electrically coupled to the board 1402. In some implementations the at least one communication chip 1406 is also physically and electrically coupled to the board 1402. In further implementations, the communication chip 1406 is part of the processor 1404.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1406 enables wireless communications for the transfer of data to and from the computing device 1400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1406 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1400 may include a plurality of communication chips 1406. For instance, a first communication chip 1406 may be dedicated to shorter range wireless communications such as Wi-Fi and Bluetooth and a second communication chip 1406 may be dedicated to longer range wireless communications such as GPS, EDGE, GPRS, CDMA, WiMAX, LTE, Ev-DO, and others.

The processor 1404 of the computing device 1400 includes an integrated circuit die packaged within the processor 1404. In some implementations of the invention, the integrated circuit die of the processor may be thermally controlled in a spray chamber with a modulated pressure, in accordance with embodiments described herein. The term "processor" may refer to any device or portion of a device that processes electronic data from registers and/or memory to transform that electronic data into other electronic data that may be stored in registers and/or memory.

The communication chip 1406 also includes an integrated circuit die packaged within the communication chip 1406. In accordance with another implementation of the invention, the integrated circuit die of the communication chip may be thermally controlled in a spray chamber with a modulated pressure, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: a temperature control system, comprising: a fluid reservoir for holding a fluid; a spray chamber fluidically coupled to the fluid reservoir; a pump between the spray chamber and the fluid reservoir, wherein the pump provides the fluid to the spray chamber; a plurality of fluid lines between the pump and the spray chamber, wherein individual ones of the plurality of fluid lines are configured to provide the fluid to the spray chamber; and a vacuum source fluidically coupled to the spray chamber, wherein the vacuum source controls a pressure within the spray chamber.

Example 2: the temperature control system of Example 1, wherein the plurality of fluid lines comprises a first fluid line and a second fluid line.

Example 3: the temperature control system of Example 2, wherein an inline heater is provided on the first fluid line.

Example 4: the temperature control system of Examples 1-3, wherein the plurality of fluid lines feed into a single input line to the spray chamber.

Example 5: the temperature control system of Example 4, wherein the single input line feeds a plurality of nozzles in the spray chamber.

Example 6: the temperature control system of Examples 1-3, wherein the plurality of fluid lines feed into a plurality of input lines to the spray chamber.

Example 7: the temperature control system of Example 6, wherein individual ones of the plurality of input lines feed different nozzles in the spray chamber.

Example 8: the temperature control system of Examples 1-7, wherein the fluid reservoir is between the vacuum source and the spray chamber.

Example 9: the temperature control system of Examples 1-8, further comprising: a cooling unit.

Example 10: the temperature control system of Example 9, wherein the cooling unit is a radiator.

Example 11: the temperature control system of Example 10, wherein an input to the cooling unit is between the pump and the spray chamber, and wherein an output of the cooling unit feeds into the fluid reservoir.

Example 12: a temperature control system, comprising: a fluid reservoir for holding a fluid; a spray chamber fluidically coupled to the fluid reservoir, wherein the spray chamber comprises: a first pressure zone; and a second pressure zone; a pump between the spray chamber and the fluid reservoir, wherein the pump provides the fluid to the spray chamber; a vacuum source fluidically coupled to the first pressure zone and the second pressure zone, and wherein the fluid reservoir is between the vacuum source and the spray chamber; a first pressure regulator between the vacuum source and the first pressure zone; and a second pressure regulator between the vacuum source and the second pressure zone.

Example 13: the temperature control system of Example 12, wherein a divider separates the first pressure zone from the second pressure zone.

Example 14: the temperature control system of Example 12 or Example 13, wherein the first pressure regulator is configured to provide a first pressure in the first pressure zone, and wherein the second pressure regulator is configured to provide a second pressure in the second pressure zone that is different than the first pressure zone.

Example 15: the temperature control system of Examples 12-14, further comprising: a first die in the first pressure zone; and a second die in the second pressure zone.

Example 16: the temperature control system of Example 15, wherein the spray chamber further comprises: first nozzles for impinging the first die with a first jet of the fluid; and second nozzles for impinging the second die with a second jet of the fluid.

Example 17: the temperature control system of Examples 12-16, wherein the vacuum source is a vacuum generator.

Example 18: the temperature control system of Example 17, wherein the vacuum generator is controlled by an air pressure regulator.

Example 19: the temperature control system of Examples 12-18, further comprising: a cooling unit.

Example 20: the temperature control system of Example 19, wherein the cooling unit is a radiator.

Example 21: the temperature control system of Example 20, wherein an input to the cooling unit is between the pump and the spray chamber, and wherein an output of the cooling unit feeds into the fluid reservoir.

Example 22: an electronic system, comprising: a board; a package substrate attached to the board; a first die attached to the package substrate; a second die attached to the package substrate; a spray chamber over the first die and the second die, wherein the spray chamber comprises: a first fluid inlet; a first nozzle fluidically coupled to the first fluid inlet, wherein the first nozzle directs fluid towards a surface of the first die; a second fluid inlet; and a second nozzle fluidically coupled to the second fluid inlet; a fluid reservoir fluidically coupled to the first fluid inlet and the second fluid inlet; and a vacuum source fluidically coupled to the spray chamber, wherein the fluid reservoir is between the spray chamber and the vacuum source.

Example 23: the electronic system of Example 22, further comprising: a pump between the fluid reservoir and the first fluid inlet and the second fluid inlet; and a first fluid line between the pump and the first fluid inlet; and a second fluid line between the pump and the second fluid inlet, wherein the second fluid line comprises an inline heater.

Example 24: the electronic system of Example 22 or Example 23, further comprising: first pressure regulator between the vacuum source and a first pressure zone around the first die; and a second pressure regulator between the vacuum source and a second pressure zone around the second die.

Example 25: the electronic system of Example 24, wherein the first pressure zone is separated from the second pressure zone by a divider extending down from the spray chamber.

What is claimed is:

1. A temperature control system, comprising:

a fluid reservoir for holding a fluid;

a spray chamber fluidically coupled to the fluid reservoir;

a pump between the spray chamber and the fluid reservoir, wherein the pump provides the fluid to the spray chamber;

a plurality of fluid lines between the pump and the spray chamber, wherein individual ones of the plurality of fluid lines are configured to provide the fluid to the spray chamber, wherein the plurality of fluid lines comprises a first fluid line and a second fluid line, and wherein an inline heater is provided on the first fluid line; and a vacuum source fluidically coupled to the spray chamber, wherein the fluid reservoir is between the vacuum source and the spray chamber, and wherein the vacuum source controls a pressure within the spray chamber.

2. The temperature control system of claim 1, wherein the plurality of fluid lines feed into a single input line to the spray chamber.

3. The temperature control system of claim 2, wherein the single input line feeds a plurality of nozzles in the spray chamber.

4. The temperature control system of claim 1, wherein the plurality of fluid lines feed into a plurality of input lines to the spray chamber.

5. The temperature control system of claim 4, wherein individual ones of the plurality of input lines feed different nozzles in the spray chamber.

6. The temperature control system of claim 1, further comprising:
a cooling unit.

7. The temperature control system of claim 6, wherein the cooling unit is a radiator.

8. The temperature control system of claim 7, wherein an input to the cooling unit is between the pump and the spray chamber, and wherein an output of the cooling unit feeds into the fluid reservoir.

9. A temperature control system, comprising:
a fluid reservoir for holding a fluid;
a spray chamber fluidically coupled to the fluid reservoir;
a pump between the spray chamber and the fluid reservoir, wherein the pump provides the fluid to the spray chamber;
a plurality of fluid lines between the pump and the spray chamber, wherein individual ones of the plurality of fluid lines are configured to provide the fluid to the spray chamber;
a vacuum source fluidically coupled to the spray chamber, wherein the fluid reservoir is between the vacuum source and the spray chamber, and wherein the vacuum source controls a pressure within the spray chamber; and
a cooling unit, wherein the cooling unit is a radiator, and wherein an input to the cooling unit is between the pump and the spray chamber, and wherein an output of the cooling unit feeds into the fluid reservoir.

10. The temperature control system of claim 9, wherein the plurality of fluid lines feed into a single input line to the spray chamber.

11. The temperature control system of claim 10, wherein the single input line feeds a plurality of nozzles in the spray chamber.

12. The temperature control system of claim 9, wherein the plurality of fluid lines feed into a plurality of input lines to the spray chamber.

13. The temperature control system of claim 12, wherein individual ones of the plurality of input lines feed different nozzles in the spray chamber.

* * * * *